United States Patent [19]
Yonehara

[11] Patent Number: 6,150,031
[45] Date of Patent: *Nov. 21, 2000

[54] SEMICONDUCTOR MEMBER AND PROCESS FOR PREPARING SEMICONDUCTOR MEMBER

[75] Inventor: Takao Yonehara, Atsugi, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/766,888

[22] Filed: Dec. 13, 1996

Related U.S. Application Data

[63] Continuation of application No. 08/562,644, Nov. 27, 1995, abandoned, which is a continuation of application No. 08/297,916, Aug. 31, 1994, abandoned, which is a division of application No. 07/740,439, Aug. 5, 1991, Pat. No. 5,371,037.

[30] Foreign Application Priority Data

Aug. 3, 1990 [JP] Japan ................................ 2-206548

[51] Int. Cl.[7] ................................................ B32B 9/00
[52] U.S. Cl. ...................... 428/446; 428/702; 438/479
[58] Field of Search .................................. 428/446, 688, 428/689, 700, 701, 702, 304.4, 312.6, 318.4, 318.6, 319.1; 437/5, 21, 62, 84, 962; 257/461; 438/459, 479, 904

[56] References Cited

U.S. PATENT DOCUMENTS

| | | | |
|---|---|---|---|
| 3,997,381 | 12/1976 | Wanlass | 156/3 |
| 4,001,864 | 1/1977 | Gibbons | 437/2 |
| 4,082,570 | 4/1978 | House | 257/461 |
| 4,380,865 | 4/1983 | Frye et al. | 156/603 |
| 4,459,181 | 7/1984 | Benjamin | 205/124 |
| 4,800,527 | 1/1989 | Ozaki et al. | 365/182 |
| 4,868,140 | 9/1989 | Yonehara | 437/109 |
| 4,939,101 | 7/1990 | Black | 437/62 |
| 5,010,033 | 4/1991 | Tokunaga et al. | 437/83 |

FOREIGN PATENT DOCUMENTS

| | | |
|---|---|---|
| 0 285 358 | 10/1988 | European Pat. Off. . |
| 53-45675 | 12/1978 | Japan . |
| 55-16464 | 2/1980 | Japan . |
| 3-104276 | 5/1991 | Japan . |

OTHER PUBLICATIONS

Mahajan ed., Concise Encyclopedia of Semiconducting Materials & Related Technologies, (1992) p. 480 (no month).

D. T. Gakkai, "LSI Hand Book", published by Ohm Company, p. 364, (Nov. 1984) with abstract.

Patent Abstracts of Japan, vol. 4, No. 44, Apr. 5, 1980 (corresponds to JP 55–16464).

X.—L. Xu et al., "Silicon On Quartz by Solid–State Diffusion Bonding (SSDB) Technology," 8030 Electronics Letters, vol. 24, No. 11, May 26, 1988, Stevenage GB, pp. 691–692.

J. Haisma, et al., "Silicon–on–Insulator Wafer Bonding–Wafer Thinning Technological Evaluations," Japanese Journal of Applied Physics, vol. 28, No. 8, Aug. 1989, pp. 1426–1443.

"Crystalline Quality of Silicon Layer Formed by Fipos Technology," K. Imai et al., Journal of Crystal Growth, vol. 63, No. 3, Oct. 11, 1983, pp. 547–553.

(List continued on next page.)

*Primary Examiner*—Marie Yamnitzky
*Attorney, Agent, or Firm*—Fitzpatrick, Cella, Harper & Scinto

[57] ABSTRACT

A semiconductor member in which a non-porous monocrystalline semiconductor region is arranged on a porous monocrystalline semiconductor region. An insulating material is bonded onto the surface of the non-porous monocrystalline layer.

7 Claims, 7 Drawing Sheets

OTHER PUBLICATIONS

"Electrolytic Shaping of Germanium and Silicon," A. Uhlir, Jr., The Bell System Technical Journal, Mar. 1956, pp. 333–347.

"Formation Mechanism of Porous Silicon Layer by Anodization in HF Solution," T. Unagami, Journal of the Electrochemical Society, vol. 127, No. 2, Feb. 1980, pp. 476–483.

"A New Dielectric Isolation Method Using Porous Silicon," K. Imai, Solid State Electronics, vol. 24, 1981, pp. 159–164 (No Month).

L. Vescan et al., "Low–Pressure Vapor–Phase Epitaxy of Silicon on Porous Silicon," Materials Letters, vol. 7, No. 3, Sep. 1988, pp. 94–98.

Takai et al., Porous Silicon Layers and its Oxide for the Silicon–on–Insulator Structure, Journal of Applied Physics, 60(1), Jul. 1, 1986.

Journal of Applied Physics, vol. 64, No. 10, Nov. 15, 1988, pp. 4943–4950, W.P. Maszara et al., "Bonding of Silicon Wafers for Silicon–On–Insulator".

Applied Physics Letters, vol. 43, No. 3, Aug. 1, 1983, pp. 263–265, M. Kimura et al., "Epitaxial Film Transfer Technique for Producing single crystal Si Film on an Insulating Substrate".

1989 IEEE SOS/SOI Technology Conference, 1989, pp. 64–65, A. Soderbarg, "Fabrication of Besoi–Materials Using Implanted Nitrogen as an Effective Etch Stop Barrier", (no month).

SEMICONDUCTOR MEMBER AND PROCESS FOR PREPARING SEMICONDUCTOR MEMBER

This application is a continuation of application Ser. No. 08/562,644 filed Nov. 27, 1995, now abandoned, which was a continuation of application Ser. No. 08/297,916 filed Aug. 31, 1994, now abandoned, which was a division of application Ser. No. 07/740.439 filed Aug. 5. 1991, now U.S. Pat. No. 5,371,037.

BACKGROUND OF THE INVENTION

1. Field of the Invention

This invention relates to a semiconductor member and a process for preparing a semiconductor member, more particularly to a semiconductor which is suitable for separation of dielectric materials or electronic devices, integrated circuits prepared on a monocrystalline semiconductor layer on an insulating material.

2. Related Background Art

Formation of a monocrystalline Si semiconductor layer on an insulating material has been widely known as the silicon on insulator (SOI) technology, and since a large number of advantages which can not be reached by bulk Si substrates for preparation of conventional Si integrated circuits are possessed by the device utilizing the SOI structure, so many researches have been done. More specifically, by utilizing the SOI structure, the following advantages can be obtained:

1. Dielectric isolation can be easily done to enable high degree of integration;
2. Radiation hardness is excellent;
3. Stray capacity is reduced to attain high speed;
4. Well formation step can be omitted;
5. Latch-up can be prevented;
6. Fully depleted field-effect transistor can be made by thin film formation.

In order to realize the many advantages in device characteristics as mentioned above, studies have been made about the method for forming the SOI structure for these some 10 years. The contents are summarized in, for example, the literature as mentioned below:

Special Issue: "Single-crystal silicon on non-single-crystal insulators"; edited by G. W. Cullen, Journal of Crystal Growth, volume 63, No.3, pp. 429–533 (1983).

Also, it has been known for a long time to for the SOS (silicon on sapphire) structure by heteroepitaxy of Si on a monocrystalline sapphire substrate by CVD (chemical vapor deposition) method. This was successful to some extent as the most mature SOI technique, but for such reasons as a large amount of crystal defects because of lattice mismatching at the interface between the Si layer and the sapphire substrate, introduction of aluminum from the sapphire substrate into the Si layer, and above all the high cost of the substrate and delay in enlargement of the substrate wafer size, it is obstructed from being widely applied. Relatively in recent years, attempts to realize the SOI structure without use of a sapphire substrate have been done. Such attempts may be broadly classified into the three shown below.

(1) After surface oxidation of a Si monocrystalline substrate, a window is formed to have the Si substrate partially exposed, and epitaxial growth is proceeded in the lateral direction with that exposed portion as the seed to form an Si monocrystalline layer on $SiO_2$. (In this case, deposition of Si layer on $SiO_2$ is accompanied).

(2) By use of a Si monocrystalline substrate itself as active layer, $SiO_2$ is formed therebeneath. (This method is accompanied with no deposition of Si layer).

(3) After epitaxial growth of Si on a Si monocrystalline substrate, isolation separation is effected. (This method is accompanied with deposition of Si layer).

As the means for realizing the above (1), there have been known the method in which a monocrystalline Si layer is formed directly to lateral epitaxial growth by CVD, the method in which amorphous Si is deposited and subjected to solid phase lateral epitaxial growth by heat treatment, the method in which amorphous or polycrystalline Si layer is irradiated convergently with an energy beam such as electron beam, laser beam, etc. and a monocrystalline layer is grown on $SiO_2$ by melting and recrystallization, and the method in which a melting region is scanned in a zone fashion by a rod-shaped heater (Zone melting recrystallization). These methods have both advantages and disadvantages. They still have many problems with respect to controllability, productivity, uniformity and quality, and none of them have been industrially applied yet to date. For example, the CVD method requires sacrifice-oxidation in flat thin film formation, while the crystallinity is poor in the solid phase growth method. On the other hand, in the beam annealing method, problems are involved in controllability such as treatment time by converged beam scanning, the manner of overlapping of beams, focus adjustment, etc. Among these, the Zone Melting Recrystallization method is the most mature, and a relatively larger scale integrated circuit has been trially made, but still a large number of crystal defects such as point defect, line defect, plane defect (sub-boundary), etc. remain, and no device driven by minority carriers has been prepared.

Concerning the method using no Si substrate as the seed for epitaxial growth which is the above method (2), for example, the following methods may be included.

1. An oxide film is formed on an Si monocrystalline substrate with V-grooves as anisotropically etched on the surface, a polycrystalline Si layer is deposited on the oxide film thick to the extent as the Si substrate, and thereafter by polishing from the back surface of the Si substrate, Si monocrystalline regions dielectrically separated by surrounding with the V-grooves on the thick polycrystalline Si layer are formed. In this method, although crystallinity is good, there are problems with respect to controllability and productivity in the step of depositing the polycrystalline Si thick as some hundred microns and the step in which the monocrystalline Si substrate is polished from the back surface to leave only the Si active layer as separated.

2. This is the method called SIMOX (Separation by ion-implanted oxygen) in which an $SiO_2$ layer is formed by ion implantation of oxygen into an Si monocrystalline substrate, which is one of the most mature methods because of good matching with the Si-IC (Integrated Circuit) process. However, for formation of the $SiO_2$ layer, $10^{18}$ ions/cm$^2$ or more of oxygen ions are required to be implanted, and the implantation time is very long to be not high in productivity, and also the wafer cost is high. Further, many crystal defects resin, and from an industrial point of view, no sufficient level of quality capable of preparing a device driven by minority carriers has been attained.

3. This is the method to form an SOI structure by dielectric isolation according to oxidation of porous Si. This is a method in which an N-type Si layer is formed on the surface of a P-type Si monocrystalline substrate in shape of islands by way of proton ion implantation (Imai et al., J. Crystal Growth, Vol. 63; 547 (1983)), or by epitaxial growth and patterning; only the p-type Si substrate is made porous by anodization in HF solution so as to surround the Si islands from the surface; and then the N-type Si islands are dielectrically isolated by accelerated oxidation. In this method, the separated Si region is determined before the device steps, whereby there is the problem that the degree of freedom in device and circuit design may be limited in some cases.

As the method (3) as described above, the method described in Japanese Laid-open Patent Application No. 55-16464 has the steps of forming an N-type monocrystalline Si layer on a P-type Si wafer, providing a glass layer containing an oxide of the N-type impurity thereon and the step of bonding the glass layer to a glass layer containing the oxide of an N-purity impurity provided on another silicon wafer by heat treatment. And, subsequent to the bonding step, the P-type Si wafer is made porous, and then the porous layer is oxidized, followed by etching to remove the porous layer, thereby forming an SOI structure. Also, Japanese Patent Publication No. 53-45675 discloses a method in which a silicon monocrystalline wafer is made porous, then oxidized to make the porous layer higher in resistance; a monocrystalline Si layer is formed on the porous silicon layer; and a part of the monocrystalline Si layer is made porous and higher in resistance so as to surround the monocrystalline Si region, thereby separating the monocrystalline Si region.

The methods described in these publications all include the step of oxidizing a porous layer, and because the volume of porous layer is increased by oxidation, sometimes an influence of distortion may be exerted on the monocrystalline Si layer, and therefore in these methods, a monocrystalline Si layer with constantly good quality could not necessarily be formed on the insulator.

SUMMARY OF THE INVENTION

An object of the present invention is to provide a semiconductor member capable of overcoming the problems as described above and meeting the demands as described above and a process for preparing the member.

Another object of the present invention is to provide a semiconductor having a monocrystalline layer excellent in crystallinity equally as monocrystalline SOI wafer, and a process for preparing the member excellent also in aspects of productivity, uniformity, controllability, economy.

Still another object of the present invention is to provide a semiconductor member having excellent characteristics which can be sufficiently alternative for expensive SOS or SIMOX even in preparing a large scale integrated circuit by the SOI structure and a process for preparing the member economically.

Other objects of the present invention than those as mentioned above are:

to provide a process for preparing a semiconductor member comprising the steps of:

forming a member having a non-porous monocrystalline semiconductor region on a porous monocrystalline semiconductor region, bonding the surface of a member of which the surface is constituted of an insulating substance onto the surface of the non-porous monocrystalline semiconductor region, and then removing the porous monocrystalline semiconductor region by chemical etching;

to provide a process for preparing a semiconductor member comprising the steps of:

forming a member having a non-porous monocrystalline semiconductor region on a porous monocrystalline semiconductor region, forming a region constituted of an insulating substance on the non-porous monocrystalline semiconductor side of the member, then bonding the surface of a member of which the surface is constituted of an insulating substance onto the surface of the region constituted of the insulating substance, and removing the porous monocrystalline semiconductor region by chemical etching;

to provide a process for preparing a semiconductor member comprising the steps of:

making a non-porous monocrystalline semiconductor member porous to form a porous monocrystalline semiconductor region, forming a non-porous monocrystalline semiconductor region on the porous monocrystalline semiconductor region, bonding the surface of a member of which the surface is constituted of an insulating substance onto the surface of the non-porous monocrystalline semiconductor region, and removing the porous monocrystalline semiconductor region by chemical etching;

to provide a process for preparing a semiconductor member comprising the steps of:

making a non-porous monocrystalline semiconductor member porous to form a porous monocrystalline semiconductor region, forming a non-porous monocrystalline semiconductor region on the porous monocrystalline semiconductor region, forming a region constituted of an insulating substance on the non-porous monocrystalline semiconductor region side, bonding the surface of a member of which the surface is constituted of an insulating substance onto the surface of the region constituted of the insulating substance, and removing the porous monocrystalline semiconductor region by chemical etching;

to provide a process for preparing a semiconductor member comprising the steps of:

making a first non-porous monocrystalline semiconductor member partially porous to form a porous monocrystalline semiconductor region and a second non-porous monocrystalline semiconductor region, forming a third non-porous monocrystalline semiconductor region on the porous monocrystalline semiconductor region, bonding the surface of a member of which the surface is constituted of an insulating substance onto the surface of the third non-porous monocrystalline semiconductor region, and removing the second non-porous monocrystalline semiconductor region mechanically, and removing the porous monocrystalline semiconductor region by chemical etching;

to provide a process for preparing a semiconductor member comprising the steps of:

making a first non-porous monocrystalline semiconductor member partially porous to form a porous monocrystalline semiconductor region and a second non-porous monocrystalline semiconductor region, forming a third non-porous monocrystalline semiconductor region on the porous monocrystalline semiconductor region, forming a region constituted of an insulating substance on the third non-porous monocrystalline semiconductor region side, bonding the surface of a member of which the surface is constituted of an insulating substance onto the surface of the region constituted of the insulating substance, and removing the second non-porous monocrystalline semiconductor region mechanically, and removing the porous monocrystalline semiconductor region by chemical etching;

to provide a process for preparing a semiconductor member comprising the steps of:

forming a second monocrystalline semiconductor region of a second electroconduction type on a first monocrystalline semiconductor region of a first electroconduction type, making the first monocrystalline semiconductor region porous to form a porous monocrystalline semiconductor region, bonding the surface of a member of which the surface is formed of an insulating substance onto the surface of the second monocrystalline semiconductor region, and removing the porous monocrystalline semiconductor region by chemical etching;

to provide a process for preparing a semiconductor member comprising the steps of:

forming a second monocrystalline semiconductor region of a second electroconduction type on a first monocrystalline semiconductor region of a first electroconduction type, making the first monocrystalline semiconductor region porous to form a porous monocrystalline semiconductor region, forming a region constituted of an insulating substance on the second monocrystalline semiconductor region side, bonding the surface of a member of which the surface is formed of an insulating substance onto the surface of the second monocrystalline semiconductor region, and removing the porous monocrystalline semiconductor region by chemical etching;

to provide a semiconductor member comprising:

a first member having a non-porous monocrystalline semiconductor region on a porous monocrystalline semiconductor region, and a second member having the surface constituted of an insulating substance bonded onto the surface of the non-porous monocrystalline semiconductor region;

to provide a semiconductor member comprising:

a first member having a non-porous monocrystalline semiconductor region and a region constituted of an insulating substance arranged in this order on a porous monocrystalline semiconductor region, and a second member bonded through a region constituted of an insulating substance onto the surface of the region constituted of the insulating substance;

to provide a semiconductor member having a non-porous silicon monocrystalline semiconductor region arranged on a region constituted of an insulating substance, characterized in that the dislocation defect density in the non-porous silicon monocrystalline semiconductor region is $2.0 \times 10^4/cm^2$ or less, and the life time of carriers is $5.0 \times 10^{-4}$ second or longer; and to provide a semiconductor member having a non-porous silicon monocrystalline semiconductor region arranged on a region constituted of an insulating substance, characterized in that the dislocation defect density in the non-porous silicon monocrystalline semiconductor region is $2.0 \times 10^4/cm^2$ or less, and the life time of carriers is $5.0 \times 10^{-4}$ sec or longer, and also the difference between the maximum value and the minimum value of the thickness of the silicon monocrystalline semiconductor region is 10% or less with respect to maximum value.

DESCRIPTION OF THE PREFERRED EMBODIMENTS

Figure 1A:
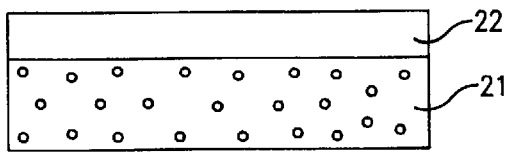
FIGS. 1A through 13F are schematic illustrations of the examples of the steps of the process for preparing the semiconductor member of the present invention.

Preferable semiconductors of the present invention are as described below.

A semiconductor member of the present invention comprises:

a first member having a non-porous monocrystalline semiconductor region provided on a porous monocrystalline semiconductor region, and a second member having the surface constituted of an insulating substance bonded onto the surface of the non-porous monocrystalline semiconductor region.

Another semiconductor member comprises:

a first member having a non-porous monocrystalline semiconductor region and a region constituted of an insulating substance arranged in this order on a porous monocrystalline semiconductor region, and a second member bonded through a region constituted of an insulating substance onto the surface of the region constituted of the insulating substance.

Still another semiconductor member has a non-porous silicon monocrystalline semiconductor region arranged on a region constituted of an insulating substance, wherein the dislocation defect density in the non-porous silicon monocrystalline semiconductor region is $2.0 \times 10^4/cm^2$ or less, and the life time of carriers is $5.0 \times 10^{-4}$ see or longer.

Still another semiconductor member has a non-porous silicon monocrystalline semiconductor region arranged on a region constituted of an insulating substance, wherein the dislocation defect density in the non-porous silicon monocrystalline semiconductor region is $2.0 \times 10^4/cm^2$ or less, and the life time of carriers is $5.0 \times 10^{-4}$ sec or longer, and also the difference between the maximum value and the minimum value of the thickness of the silicon monocrystalline semiconductor region is 10% or less, with respect to the maximum value.

Preferable processes for preparing the semiconductor member of the present invention are as described below.

A process for preparing a semiconductor member of the present invention comprises:

forming a member having a non-porous monocrystalline semiconductor region on a porous monocrystalline semiconductor region, bonding the surface of a member of which the surface is constituted of an insulating substance onto the surface of the non-porous monocrystalline semiconductor region, and then removing the porous monocrystalline semiconductor region by chemical etching.

Another process comprises:

forming a member having a non-porous monocrystalline semiconductor region on a porous monocrystalline semiconductor region, forming a region constituted of an insulting substance on the non-porous monocrystalline semiconductor side of the member, then bonding the surface of a member of which the surface is constituted of an insulating substance onto the surface of the region constituted of the insulating substance, and removing the porous monocrystalline semiconductor region by chemical etching.

Still another process comprises:

making a non-porous monocrystalline semiconductor member porous to form a porous monocrystalline semiconductor region, forming a non-porous monocrystalline semiconductor region on the porous monocrystalline semiconductor region, bonding the surface of a member of which the surface is constituted of an insulating substance onto the surface of the non-porous monocrystalline semiconductor region, and removing the porous monocrystalline semiconductor region by chemical etching.

Still another process comprises the steps of:

making a non-porous monocrystalline semiconductor member porous to form a porous monocrystalline semiconductor region, forming a non-porous monocrystalline semiconductor region on-the porous monocrystalline semiconductor region, forming a region constituted of an insulating substance on the non-porous monocrystalline semiconductor region side, bonding the surface of a member of which the surface is constituted of an insulating substance onto the surface of the region constituted of the insulating substance, and removing the porous monocrystalline semiconductor region by chemical etching.

Still another process comprises the steps of:

making a first non-porous monocrystalline semiconductor member partially porous to form a porous monocrystalline semiconductor region and a second non-porous monocrystalline semiconductor region, forming a third non-porous monocrystalline semiconductor region on the porous monocrystalline semiconductor region, bonding the surface of a member of which the surface is constituted of an insulating substance onto the surface of the third non-porous monocrystalline semiconductor region, and removing the second non-porous monocrystalline semiconductor region by mechanical grinding, and removing the porous monocrystalline semiconductor region by chemical etching.

Still another process comprises the steps of:

making a first non-porous monocrystalline semiconductor member partially porous to form a porous monocrystalline semiconductor region and a second non-porous monocrystalline semiconductor region, forming a third non-porous monocrystalline semiconductor region on the porous monocrystalline semiconductor region, forming a region constituted of an insulating substance on the third non-porous monocrystalline semiconductor region side, bonding the surface of a member of which the surface is constituted of an insulating substance onto the surface of the region constituted of the insulating substance, and removing the second non-porous monocrystalline semiconductor by mechanical grinding, and removing the porous monocrystalline semiconductor region by chemical etching.

Still another process comprises the steps of:

forming a second monocrystalline semiconductor region of a second conduction type on a first monocrystalline semiconductor region of a first conduction type, making the first monocrystalline semiconductor region porous to form a porous monocrystalline semiconductor region, forming a region constituted of an insulating material on the second monocrystalline semiconductor region side, bonding the surface of a member of which the surface is constituted of an insulating substance onto the surface of the second monocrystalline semiconductor region, and removing the porous monocrystalline semiconductor region by chemical etching.

Still another process comprises the steps of:

forming a second monocrystalline semiconductor region of a second electroconduction type on a first monocrystalline semiconductor region of a first electroconduction type, making the first monocrystalline semiconductor region porous to form a porous monocrystalline semiconductor region, forming a region constituted of an insulating substance on the second monocrystalline semiconductor region side, bonding the surface of a member of which the surface is formed of an insulating substance onto the surface of the region constituted of the insulating substance, and removing the porous monocrystalline semiconductor region by chemical etching.

The semiconductor member of the present invention has a monocrystalline semiconductor region where carrier life time is long and the defect is extremely little on an insulating material with excellent uniformity of thickness, and is applicable to various semiconductor devices. Also, the semiconductor member of the present invention is capable of high speed response, and is applicable to semiconductor devices rich in reliability. The semiconductor member of the present invention can be also an alternative for expensive SOS or SIMOX.

The process for preparing a semiconductor member of the present invention provides a process excellent in aspects of productivity, uniformity, controllability, economy in obtaining an Si crystal layer having crystallinity equal to monocrystalline wafer on an insulating material.

Further, according to the process for preparing a semiconductor member of the present invention, it is possible to provide semiconductor members wherein the advantages of the SOI device of the prior art can be realized and applied.

Also, according to the present invention, there can be provided a process for preparing a semiconductor member which can be an alternative for expensive SOS or SIMOX also in preparing a large scale integrated circuit of SOI structure.

The process for preparing a semiconductor member of the present invention, as is described in detail in Examples, makes it possible to perform the treatment efficiently within a short time, and is excellent in its productivity and economy.

Referring now to silicon as an example of semiconductor materials, the present invention is described in detail, but the semiconductor material in the present invention is not limited to silicon at all.

In porous Si layer, according to observation by transmission electron microscopy, pores with diameters of about 600 angstroms on an average are formed, and despite the fact that their density is half or lower as compared with monocrystalline silicon, momocrystallinity is maintained. Monocrystal refers to a crystalline solid such that, when calling attention on an optional crystal axis, its direction is the same at any part of the sample, and the porous layer used in the present invention, although having pores therethrough, the crystal axis in the crystalline region is the same in the direction at any part, thus being monocrystalline. And, epitaxial growth of a monocrystalline Si layer onto the porous layer is possible. However, at a temperature of 1000° C. or higher, rearrangement of the atoms positioned around the inner pores takes place, whereby the characteristics of accelerated chemical etching may be sometimes impaired. For this reason, in the present invention, for epitaxial growth of Si layer, there may be suitably used the crystal growth method capable of low temperature growth such as molecular beam epitaxial growth, plasma CVD, low pressure CVD method, photo CVD, bias-sputtering method, liquid phase growth method, etc.

Since the porous layer has a large amount of voids formed internally thereof, its density can be reduced to half or lower. As the result, the surface area per unit volume (specific surface area) can be dramatically increased, and therefore its chemical etching rate is remarkably accelerated as compared with that of the etching rate of conventional non-porous monocrystalline layer. The present invention utilizes the two above-mentioned characteristics of the semiconductor as made porous, namely the fact that single crystallinity is maintained and a non-porous semiconductor monocrystal can therefore be epitaxially grown on the semiconductor substrate as made porous, and the fact that etching rate is remarkably more rapid as compared with non-porous monocrystal, whereby a non-porous semiconductor monocrystalline layer of high quality can be formed on a substrate having an insulating material surface within a short time.

The porous layer can be more readily formed on a P-type Si layer than an N-type Si layer for the following reason. First, a porous Si was discovered by Uhlir et al. in the research process of electrolytic polishing of semiconductor in 1956 (A. Uhlir, Bell Syst. Tech. J., vol 35, p.333 (1956)).

Unagami et al. studied about the dissolving reaction of Si in anodization, and has reported that positive holes are necessary for the anodic reaction of Si in an HF solution, and the reaction is as follows (T. Unagami, J. Electrochem. Soc., vol. 127, p. 476 (1980)).

$$Si+2HF+(2-n)e^+ \rightarrow SiF_2+2H^+ +ne^-$$

$$SiF_2+2HF \rightarrow SiF_4+H_2$$

$$SiF_4+2HF \rightarrow H_2SiF_6$$

or $$Si+4HF+(4-\lambda)e^+ \rightarrow SiF_4+4H^+ +\lambda e^-$$

$$SiF_4+2HF \rightarrow H_2SiF_6.$$

Here, $e^+$ and $e^-$ represent a positive hole and an electron, respectively. n and $\lambda$ are respectively numbers of positive holes necessary for dissolving one atom of silicon, and it has been postulated that porous silicon is formed when satisfying the condition of $n>2$ or $\lambda>4$.

For the reasons mentioned above, the P-type silicon in which positive holes exist will be more readily made porous than the N-type silicon of the opposite characteristic. Selectivity in such pore structure formation has been verified by Nagano et al. (Nagano, Nakajima, Yasuno, Ohnaka, Kajiwara; Denshi Tsushin Gakkai Gijutsu Kenkyu Hokoku, vol. 79, SSD 79-9549(1979)) and Imai, (K. Imai; Solid-State Electronics vol. 24, 159 (1981)). However, depending on the conditions, the N-type silicon can be also made porous.

Referring now to the drawings, the present invention is described in more detail.

Embodiment 1

Description is made about the process for obtaining a semiconductor substrate by making porous all of a P-type substrate and permitting a monocrystalline layer to be epitaxially grown.

As shown in FIG. 1A, first a P-type Si monocrystalline substrate is provided, and all of it is made porous. According to the crystal growth method capable of low temperature growth as mentioned above, epitaxial growth is effected on the substrate surface as made porous to form a thin film monocrystalline layer 22. The above P-type Si substrate is made porous by the anodization method by use of an HF solution. The porous Si layer 21 can be varied in its density to a range of 1.1 to 0.6 g/cm³ by varying the HF solution concentration to 50 to 20% as compared with the density 2.33 g/cm³ of the monocrystalline Si.

Figure 1B:
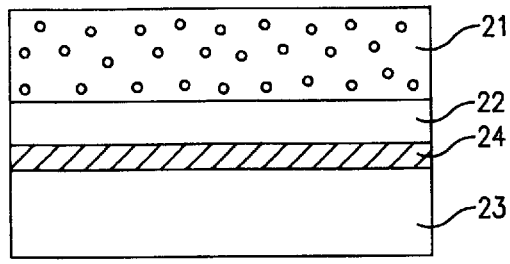

Subsequently, as shown in FIG. 1B, by providing another Si substrate 23 and after forming an oxidized layer 24 on its surface, the Si substrate 23 having the oxidized layer 24 on the surface is bonded onto the surface of the monocrystalline layer 22 on the porous Si substrate 21. Then, as shown in FIG. IC, the porous Si substrate 21 is all etched away to form a thin film-like monocrystalline silicon layer 22 remaining on the SiO₂ layer 24. In the present invention, since the porous semiconductor layer is etched away without application of the oxidation treatment on the porous semiconductor layer, the oxidation swelling of the porous semiconductor layer can be prevented, whereby the influence of distortion on the monocrystalline layer as epitaxially grown can be prevented. According to this method, the monocrystalline Si layer 22 equal to silicon wafer in crystallinity is formed flat and yet uniformly thinly over the whole wafer region with a large area on the oxidized Si layer 24 which is an insulating material. The semiconductor substrate thus obtained can be suitably used also with respect to preparation of an insulation separated electronic device.

Here, the thickness of the non-porous semiconductor crystalline layer to be formed on the porous semiconductor substrate may be desirably made preferably 50 μm or less, more preferably 20 μm or less, for forming a thin film semiconductor device on the above semiconductor monocrystalline layer.

Bonding between the above non-porous semiconductor monocrystal and the substrate having the insulating material surface should be preferably performed in an atmosphere of nitrogen, an inert gas or a gas mixture of these, or in an atmosphere containing an inert gas or nitrogen, and further desirably under heated state.

As the etchant for selectively etching the above semiconductor substrate as made porous with the above non-porous semiconductor monocrystalline layer as bonded onto the substrate having the insulating material surface being left to remain, for example, there may be employed etchants such as aqueous sodium hydroxide solution, aqueous potassium hydroxide solution, hydrofluoric acid-nitric acid-acetic acid mixed solution, etc.

The substrate having an insulating material which can be used in the present invention may be one with at least its surface being constituted of an insulating material, or one with all of the substrate being constituted of an insulating material. Examples of the substrate with the surface being constituted of an insulating material may include monocrystalline or polycrystalline silicon substrates having the surface oxidized, electroconductive or semiconductive substrates having a layer of an insulating material such as oxide, nitride, boride, etc. formed on the surface, etc. Specific examples of the substrates wholly constituted of an insulating material may include substrates comprising insulating materials such as fused silica glass, sintered alumina, etc.

Meanwhile, in the present Embodiment 1, an example of forming a non-porous semiconductor monocrystalline layer on a porous semiconductor substrate has been shown, but the present invention is not limited only to the mode of the Embodiment 1 as described above, but a porous semiconductor substrate having a non-porous semiconductor monocrystalline layer may be also formed by applying a pore forming treatment on a substrate having a monocrystalline layer comprising a material which can be made porous with difficulty (e.g. N-type silicon) and a layer comprising a material which can be readily made porous (e.g. P-type silicon).

Also, in the step of removing the porous semiconductor substrate by etching, the substrate may be also coated with an etching preventive material except for the porous semiconductor substrate during etching, so that the non-porous semiconductor monocrystalline layer and the substrate having the insulating material surface may not be deleteriously influenced by the etchant.

The non-porous monocrystalline layer on the insulating material thus formed can be one having $5.0 \times 10^{-4}$ sec. or longer in terms of the life time of carriers, having remarkably less crystal defect such as through dislocation, etc. and also being extremely small in distribution of the layer thickness of the semiconductor monocrystalline layer. Specifically, the dislocation defect density becomes $2 \times 10^4$/cm$^2$ or less, and concerning the layer thickness of the semiconductor monocrystalline layer, within the range of the area of the semiconductor monocrystalline layer from 20 cm$^2$ to 500 cm$^2$ (2 inches wafer to 10 inches wafer), the difference between the maximum value and the minimum value of the thickness of the semiconductor monocrystalline layer can be suppressed below 10% or less based on the maximum value.

In the following, other embodiments are shown.

Embodiment 2

Referring now to FIGS. 2A to 2D, Embodiment 2 is described in detail.

Figure 2A:
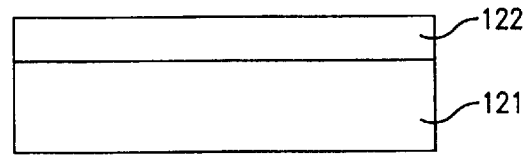

First, as shown in FIG. 2A, a low impurity concentration layer 122 is formed by epitaxial growth according to various thin film growth methods. Alternatively, protons may be ion implanted into the surface of the P-type Si monocrystalline substrate 121 to form an N-type monocrystalline layer 122.

Figure 2B:
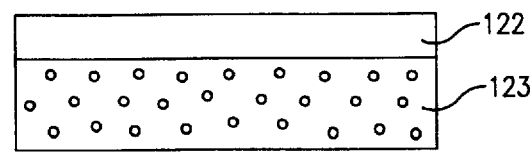

Next, as shown in FIG. 2B, the back surface of the P-type monocrystalline substrate 121 is denatured into a porous Si substrate 123 according to the anodization method by use of an HF solution. The porous Si layer 123 can be varied in its density to a range of 1.1 to 0.6 g/cm$^3$ by varying the HF solution concentration within the range of 50 to 20% as compared with the density of the monocrystalline Si of 2.33 g/cm$^3$. The porous layer, as described above, is formed on the P-type substrate.

Figure 2C:
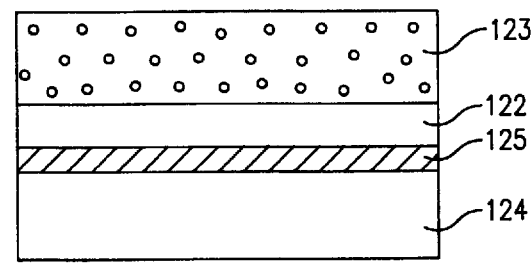
Figure 2D:
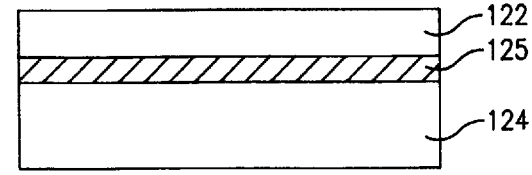

As shown in FIG. 2C, by providing another Si substrate 124 and after forming an oxidized layer 125 on its surface, the Si substrate 124 having the oxidized layer 125 on its surface is bonded to the surface of the monocrystalline Si layer 122 on the porous Si substrate 123.

Then, the porous Si substrate 123 is all etched to leave a monocrystalline silicon layer 122 as thin film on the SiO$_2$ layer 125, thereby forming a semiconductor substrate.

According to this process, the monocrystalline Si layer 122 equal in crystallinity to silicon wafer is formed on the oxidized layer 125 which is an insulating material to be flat and to be yet made uniformly into thin layer, over the whole wafer region with a large area.

The semiconductor substrate thus obtained can be used suitably also with respect to preparation of an insulation separated electronic device.

The above Embodiment 2 is an example of the process of forming an N-type layer on a P-type substrate before pore formation, and then making selectively only the P-type substrate porous by anodization. Also in the present Embodiment, a semiconductor substrate having a semiconductor monocrystalline layer with the same performances as Embodiment 1 can be obtained.

Embodiment 3

Figure 3A:
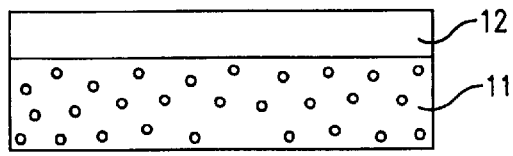

As shown in FIG. 3A, first a P-type Si monocrystalline substrate is prepared and all of it is made porous. According to various growth methods, epitaxial growth is effected on the substrate surface made porous to form a thin film monocrystalline layer 12.

Figure 3B:
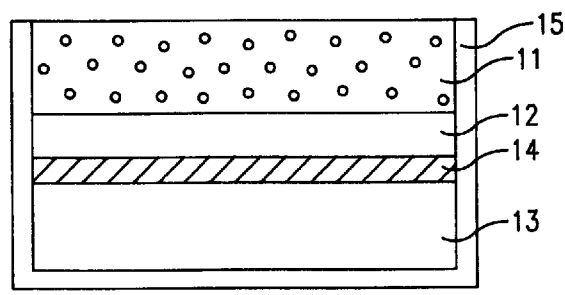

As shown in FIG. 3B, by preparing another Si substrate 13 and after forming an oxidized layer 14 on its surface, the Si substrate having the oxidized layer 14 on the surface is bonded to the surface of the monocrystalline Si layer 12 on the porous Si substrate 11.

Figure 3C:
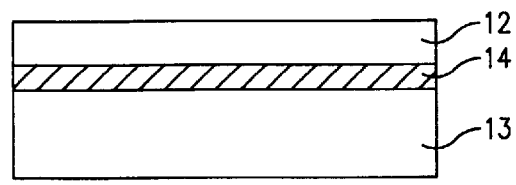

Next, as shown in FIG. 3B, an Si$_3$N$_4$ layer 15 is deposited to cover over the whole of the bonded two silicon wafers as the anti-etching film. Subsequently, as shown in FIG. 3C, the Si$_3$N$_4$ layer on the surface of the porous silicon substrate is removed. As another anti-etching film material, Apiezon Wax may be also employed in place of Si$_3$N$_4$ Then, the porous Si substrate 11 is all etched and a monocrystalline silicon layer 12 made into a thin film remains on the SiO$_2$ layer 14 to form a semiconductor substrate.

FIG. 3C shows a semiconductor substrate obtained in the present invention. More specifically, by removing the Si$_3$N$_4$ layer 15 as the anti-etching film in FIG. 3B, a monocrystalline Si layer 12 of which crystallinity is equal to that of bulk wafer is formed through the SiO$_2$ layer 14 which is an insulating substance on the Si substrate 13, flat and yet uniformly into a thin layer, over the whole wafer region with a large area. The semiconductor substrate thus obtained can be used suitably also with respect to preparation of a discrete insulated electronic device. Also in the present Embodiment, a semiconductor substrate having a semiconductor monocrystalline layer with the same performances as Embodiment 1 can be obtained.

Embodiment 4

Figure 4A:
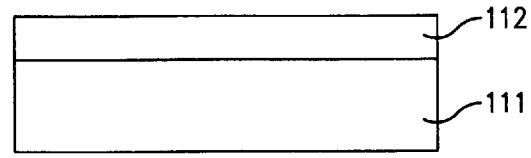
Figure 4B:
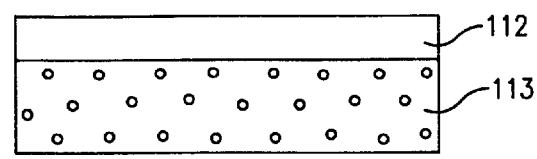

Referring now to FIGS. 4A to 4B, the Embodiment 4 of the present invention is described below in detail.

First, as shown in FIG. 4A, a low impurity concentration layer 112 is formed by epitaxial growth according to various thin film growth methods. Alternatively, protons may be ion-implanted into the surface of the P-type Si monocrystalline substrate 111 to form an N-type monocrystalline layer 112.

Next, as shown in FIG. 4B, the back surface of the P-type monocrystalline substrate 111 is denatured into a porous Si substrate 113 according to the anodization method by use of an HP solution. The porous Si layer 113 can be varied in its density to a range of 1.1 to 0.6 $g/cm^3$ by varying the HF solution concentration to 50 to 20% as compared with the density of the monocrystalline Si of 2.33 $g/cm^3$. The porous layer 113, as described above, is formed from the P-type substrate.

Figure 4C:
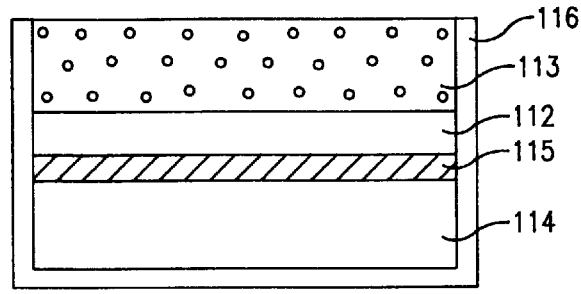

As shown in FIG. 4C, by preparing another Si substrate 114 and after forming an oxidized layer 115 on its surface, the Si substrate 114 having the oxidized layer 115 on the surface is bonded on the surface of the monocrystalline Si layer 112 on the porous Si substrate 113.

Figure 4D:
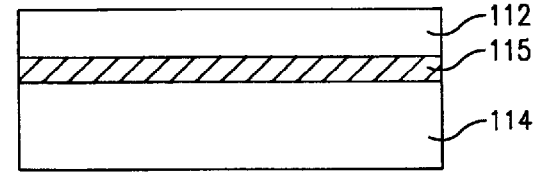

Here, as shown in FIG. 4C, as the anti-etching film 116, an $Si_3N_4$ layer 116 is deposited to cover over the whole of the bonded two silicon wafers as the anti-etching film. Subsequently, as shown in FIG. 4C, the $Si_3N_4$ layer on the surface of the porous silicon substrate is removed. As another anti-etching film 116, a material excellent in etching resistance such as Apiezon Wax may be also employed in place of $Si_3N_4$ Then, the porous Si substrate 113 is all etched to form a semiconductor substrate by retaining a monocrystalline silicon layer 112 made into a thin film on the $SiO_2$ layer 115. FIG. 4D shows a substrate having the semiconductor layer obtained in the present invention. That is, by removing the $Si_3N_4$ layer 116 as the anti-etching film 116 shown in FIG. 4C, a monocrystalline Si layer 112 is formed on the $SiO_2$ layer 115 which is the insulating material, flat and yet uniformly into a thin layer, over the whole wafer region with a large area.

The semiconductor thus obtained will not be deleteriously affected by the etchant, and can be used suitably also with respect to preparation of a discrete insulated electronic device.

Also, the semiconductor substrate obtained in the present Embodiment has the same performances as that obtained in Embodiment 1.

Embodiment 5

Figure 5A:
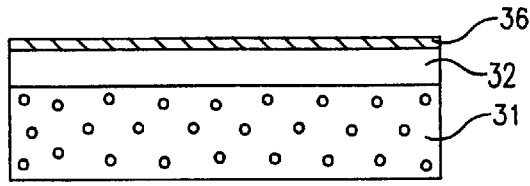

As shown in FIG. 5A, first, a P-type Si monocrystalline substrate is prepared and all of it is made porous. A thin film monocrystalline layer 32 is formed by effecting epitaxial growth on the substrate surface made porous according to various growth methods.

Figure 5B:
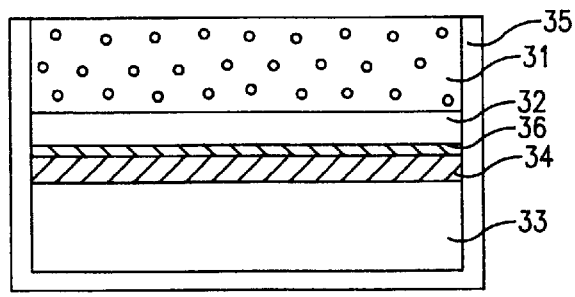
Figure 5C:
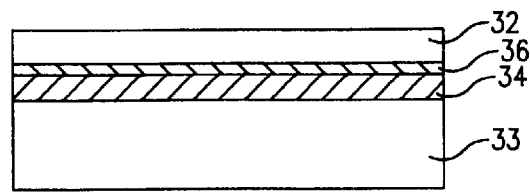

As shown in FIG. 5B, by preparing another Si substrate 33 and after forming an oxidized layer 34 on its surface, the Si substrate 33 having the oxidized layer 34 on the surface is bonded to the surface of the oxidized layer 36 formed on the monocrystalline Si layer 32 on the porous substrate 31. The bonding step is practiced by closely contacting the cleaned surfaces with each other, followed by heating in an inert gas atmosphere or nitrogen atmosphere. The oxidized layer 34 is formed in order to reduce the interface level of the non-porous monocrystalline layer 32 which is the final active layer. As shown in FIG. 5B, an $Si_3N_4$ layer 35 is deposited as the anti-etching film to be coated on the bonded two silicon wafers as a whole. Subsequently, as shown in FIG. 5C, the $Si_3N_4$ layer 35 on the surface of the porous silicon substrate 31 is removed. As another anti-etching film material, Apiezon Wax, etc. may be also employed in place of $Si_3N_4$. Then, all of the porous Si substrate 31 is etched to have the monocrystalline silicon layer 32 made into a thin film remaining on the $SiO_2$ layer, thereby forming a semiconductor substrate.

FIG. 5C shows the substrate having the semiconductor layer obtained in the present invention. More specifically, by removing the $Si_3N_4$ layer 35 as the anti-etching film shown in FIG. 5B, the monocrystalline Si layer 32 equal in crystallinity to silicon wafer is formed through the $SiO_2$ layers 34 and 36 on the Si substrate 33, flat and yet uniformly into a thin layer, over the whole wafer region with a large area. The semiconductor substrate thus obtained can be used suitably also with respect to preparation of a discrete insulated electronic device. Also, the semiconductor substrate obtained in the present Embodiment has the same performances as that obtained in Embodiment 1.

Embodiment 6

Referring now to FIGS. 6A to 6D, the Embodiment 6 of the present invention is described below in detail.

Figure 6A:
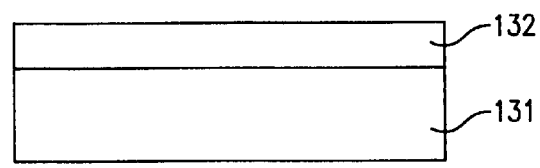

First, as shown in FIG. 6A, a low impurity concentration layer 132 is formed by epitaxial growth according to various thin film growth methods. Alternatively, the surface of the P-type Si monocrystalline substrate 131 is subjected to ion implantation of protons to form an N-type monocrystalline layer 132.

Figure 6B:
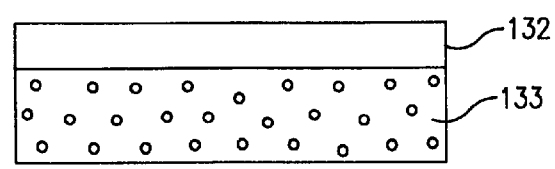

Next, as shown in FIG. 6B, the P-type Si monocrystalline substrate 131 is denatured from the back surface to a porous Si substrate 133 by the anodization method with an HF solution. The porous Si layer 133 can be varied in its density in the range of 1.1 to 0.6 $g/cm^3$ by varying the HF solution concentration to 50 to 20% as compared with the density of the monocrystalline Si of 2.33 $g/cm^3$. The porous layer, as described above, is formed from the P-type substrate.

Figure 6C:
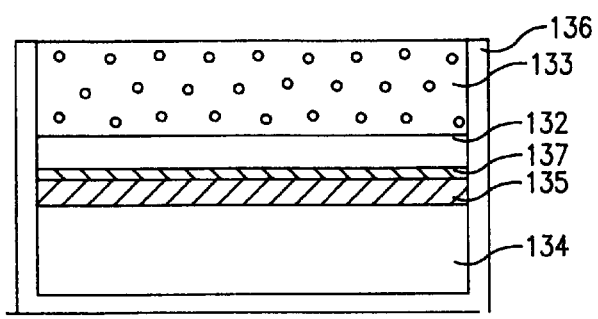

As shown in FIG. 6C, by preparing another Si substrate 134 and after forming an oxidized layer 135 on its surface, the Si substrate 134 having the oxidized layer 135 is bonded onto the surface of the oxidized layer 137 formed on the monocrystalline Si layer 132 on the porous Si substrate 133.

Figure 6D:
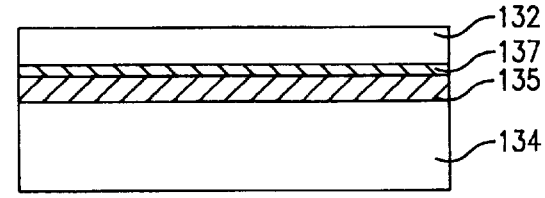

Subsequently, as the anti-etching film 136, an $Si_3N_4$ layer 136 is deposited to be coated on the bonded two silicon wafers as a whole. Then, as shown in FIG. 6D, the $Si_3N_4$ layer 136 on the surface of the porous silicon substrate 133 is removed. Then the porous Si substrate 131 is all chemically etched to have a monocrystalline silicon layer made into a thin film remain on the $SiO_2$ layers 135 and 137, thereby forming a semiconductor substrate.

The semiconductor substrate thus obtained is excellent in adhesion between the respective layers, and can be also used suitably also with respect to preparation of an isolation separated electronic device. Also, the semiconductor substrate obtained in the present Embodiment has the same performances as that obtained in Embodiment 1.

Embodiment 7

Figure 7A:
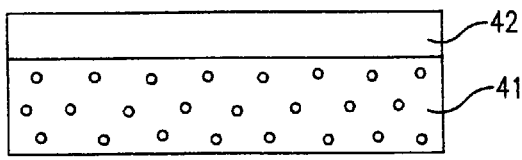
Figure 7B:
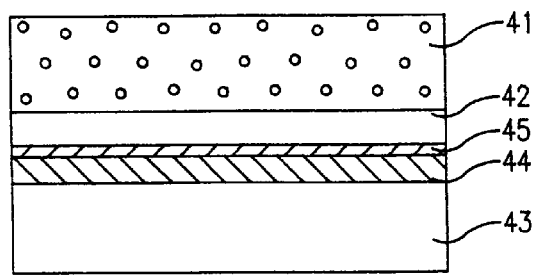

As shown in FIG. 7A, first, a P-type Si monocrystalline substrate is prepared and all of it is made porous. According to various growth methods, epitaxial growth is effected on the substrate surface made porous to form a thin film monocrystalline layer 42. As shown in FIG. 7B, by preparing another Si substrate 43 and after forming an oxidized layer 44 on its surface, the Si substrate 43 having the above oxidized layer 44 on the surface is bonded onto the surface of the oxidized layer 45 formed on the monocrystalline Si layer 42 on the porous Si substrate 41. This bonding step is practiced by closely contacting cleaned surfaces with each other, followed by heating in an inert gas atmosphere or nitrogen atmosphere. The oxidized layer 44 is formed in order to reduce the interface level of the monocrystalline layer 42 which is the active layer as the final semiconductor.

Figure 7C:
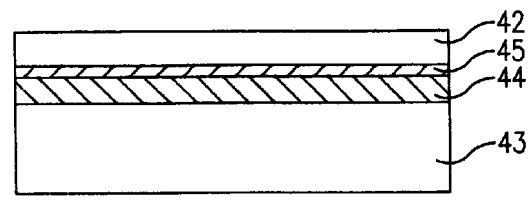

As shown in FIG. 7C, the porous Si substrate 41 is all etched to have the monocrystalline silicon layer made into a thin film on the SiO$_2$ layers 44 and 45, thereby forming a semiconductor substrate. FIG. 7C shows the semiconductor substrate obtained in the present invention.

A monocrystalline Si layer 42 equal in crystallinity to silicon wafer is formed through the SiO$_2$ layers 44 and 45 on the Si substrate 43, flat and yet uniformly into a thin layer, over the whole wafer region with a large area. The semiconductor substrate thus obtained can be also used suitably also as seen from the standpoint of preparation of an isolation separated electron device. Also, the semiconductor substrate obtained in the present embodiment has the same performances as that obtained in Embodiment 1.

Embodiment 8

Referring now to FIGS. 8A to 8D, the Embodiment 8 of the present invention is described below in detail.

Figure 8A:
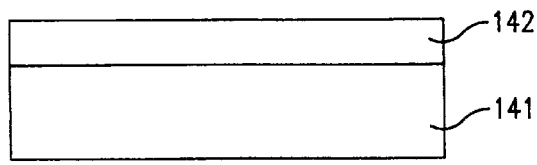

First, as shown in FIG. 8A, a low impurity concentration layer 142 is formed by epitaxial growth according to various thin film growth methods. Alternatively, the surface of the P-type Si monocrystalline substrate 141 is subjected to ion implantation of protons to form an N-type monocrystalline layer 142.

Figure 8B:
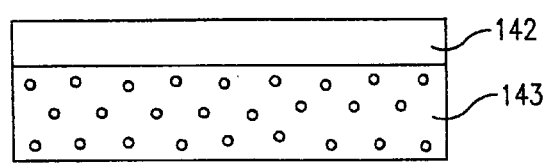

Next, as shown in FIG. 8B, the P-type Si monocrystalline substrate 141 is denatured from the back surface to a porous Si substrate 143 by the anodization method with an HF solution. The porous Si layer 143 can be varied in its density in the range of 1.1 to 0.6 g/cm$^3$ by varying the HF solution concentration to 50 to 20% as compared with the density of the monocrystalline Si of 2.33 g/cm$^3$. The porous layer, as described above, is formed on the P-type substrate 141.

Figure 8C:
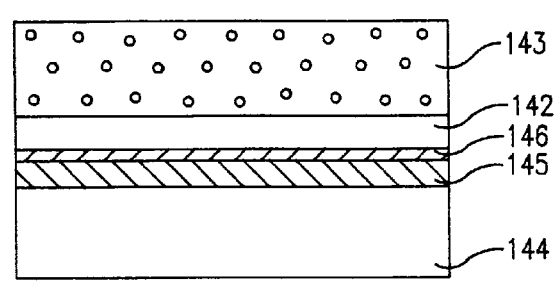

As shown in FIG. 8C, by preparing another Si substrate 144 and after forming an oxidized layer 145 on its surface, the Si substrate 144 having the oxidized layer 145 is bonded onto the surface of the oxidized layer 146 formed on the monocrystalline Si layer 142 on the porous Si substrate 143.

Then the porous Si substrate is all chemically etched to have a monocrystalline silicon layer made into a thin film remaining on the SiO$_2$ layers 145 and 146, thereby forming a semiconductor substrate.

Figure 8D:
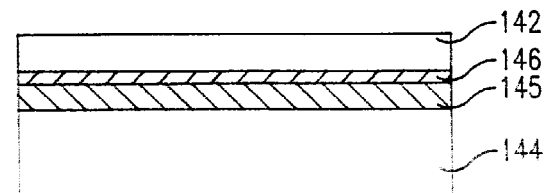

FIG. 8D shows the semiconductor substrate obtained in the present invention. A monocrystalline Si layer 142 equal in crystallinity to silicon wafer is formed through the SiO$_2$ layers 145 and 146 on the Si substrate 144, flat and yet uniformly into a thin layer, over the whole wafer region with a large area.

The semiconductor substrate thus obtained can be also used suitably also with respect to preparation of an isolation separated electronic device. Also, the semiconductor substrate obtained in the present Embodiment has the same performances as that obtained in Embodiment 1.

Embodiment 9

Figure 9A:
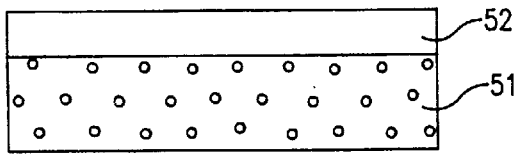

As shown in FIG. 9A, first, a P-type Si monocrystalline substrate is prepared, and all of it is made porous. According to various growth methods, epitaxial growth is effected on the surface of the substrate 51 made porous to form a thin film monocrystalline layer 52.

Figure 9B:
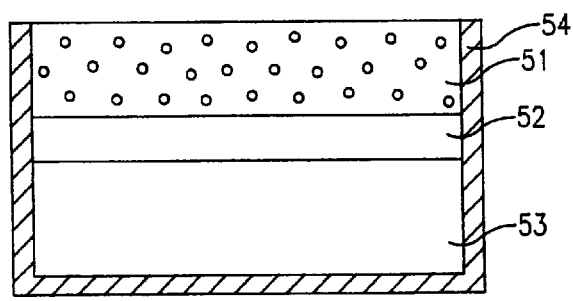

As shown in FIG. 9B, a light-transmissive substrate 53 represented by glass is prepared and the light-transmissive substrate 53 is bonded onto the surface of the monocrystalline Si layer 52 on the porous Si substrate 51.

Figure 9C:
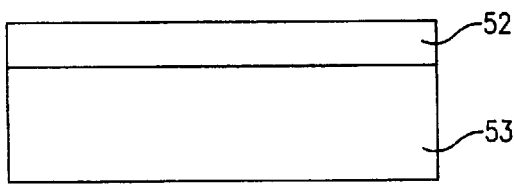

Here, as shown in FIG. 9B, as the anti-etching film 54, an Si$_3$N$_4$ layer 54 is deposited to be coated on the bonded two substrates as a whole. Subsequently, as shown in FIG. 9C, the Si$_3$N$_4$ layer 54 on the surface of the porous silicon substrate is removed. Then, the porous Si substrate 51 is all etched away to have a monocrystalline silicon layer 52 made into a thin film remaining on the light-transmissive substrate 53, thereby forming a semiconducor substrate. FIG. 9C shows the semiconductor substrate obtained in the present invention.

The semiconductor substrate thus obtained can be also used suitably as seen from the standpoint of preparation of an electronic device isolation separated with a light-transmissive insulating material. Also, the semiconductor obtained in the present Embodiment has the same performances as that obtained in Embodiment 1.

Embodiment 10

Referring now to FIGS. 10A to 10D, the Embodiment 10 of the present invention is described below in detail.

Figure 10A:
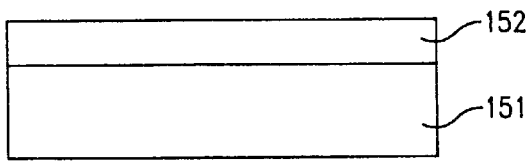

First, as shown in FIG. 10A, a low impurity concentration layer 152 is formed by epitaxial growth according to various thin film growth methods. Alternatively, the surface of the P-type Si monocrystalline substrate 151 is subjected to ion implantation of protons to form an N-type monocrystalline layer 152.

Figure 10B:
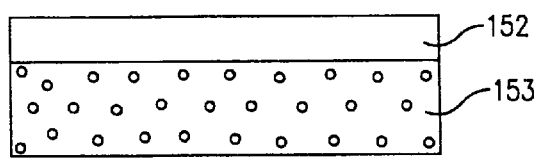

Next, as shown in FIG. 10B, the P-type Si monocrystalline substrate 151 is denatured from the back surface to a porous Si substrate 153 by the anodization method with an HF solution. The porous Si layer 153 can be varied in its density in the range of 1.1 to 0.6 g/cm$^3$ by varying the HF solution concentration to 50 to 20% as compared with the density of the monocrystalline Si of 2.33 g/cm$^3$. The porous layer 153, as described above, is formed on the P-type substrate 151.

Figure 10C:
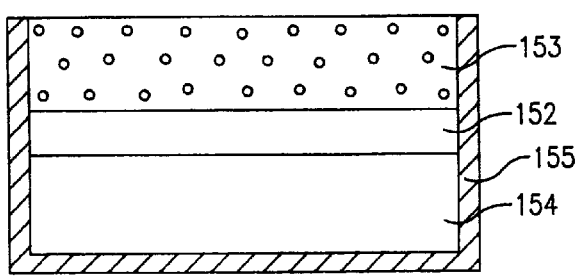
Figure 10D:
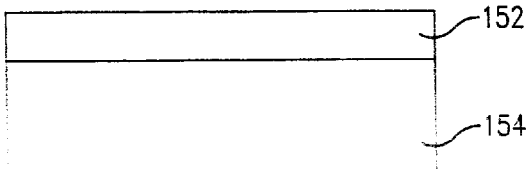

As shown in FIG. 10C, after preparing a light-transmissive substrate 154, onto the surface of the monocrystalline Si layer 152 on the porous Si substrate 153 is bonded the light-transmissive substrate 154. Then, as shown in FIG. 10C, as an anti-etching film 155, an Si$_3$N$_4$ layer, etc. Is deposited to be coated on the bonded two substrates as a whole. Subsequently, as shown in FIG. 10D, the Si$_3$N$_4$ layer 155 on the surface of the porous silicon substrate 153 is removed. Then, the porous Si substrate 153 is all etched away to have the monocrystalline silicon layer 152 made into a thin film remaining on the light-transmissive substrate 154, thereby forming a semiconductor substrate.

FIG. 10D shows the semiconductor substrate obtained in the present invention. It is the monocrystalline Si layer 152 equal in crystallinity to silicon wafer formed on the light-transmissive substrate 154, flat and yet uniformly into a thin layer, over the whole wafer region with a large area.

The semiconductor substrate thus obtained can be also used suitably also with respect to preparation of an isolation separated electronic device with a light-transmissive insulating material. Also, the semiconductor substrate obtained in the present Embodiment has the same performances as that obtained in Embodiment 1.

Embodiment 11

Figure 11A:
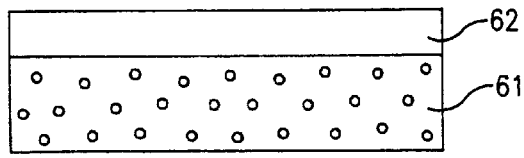

As shown in FIG. 11A, first, a P-type Si monocrystalline substrate is prepared, and all of it is made porous. According to various growth methods, epitaxial growth is effected on the surface of the substrate 61 made porous to form a thin film monocrystalline layer 62.

Figure 11B:
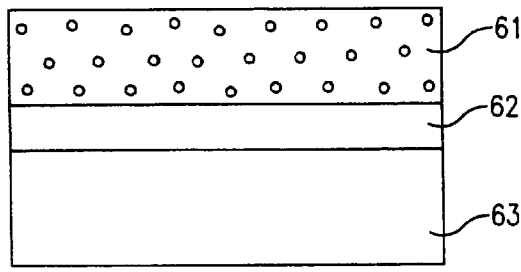

As shown in FIG. 11B, a light-transmissive substrate 63 represented by glass is prepared and the light-transmissive substrate 63 is bonded to the surface of the monocrystalline Si layer 62 on the porous Si substrate 61.

Then, the porous Si substrate 61 is all etched to have the monocrystalline silicon layer 62 made into a thin film remaining on the light-transmissive substrate 63, thereby forming a semiconductor substrate.

Figure 11C:
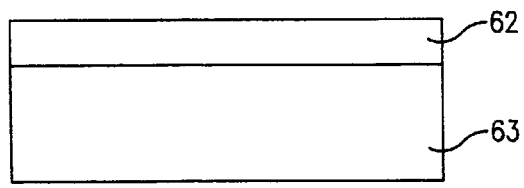

FIG. 11C shows the semiconductor substrate obtained in the present invention. It is the monocrystalline Si layer 62 equal in crystallinity to silicon wafer formed on the light-transmissive substrate 63, flat and yet uniformly into a thin layer, over the whole wafer region with a large area. The semiconductor thus obtained can be also suitably used also with respect to preparation of an electronic device isolation separated with a light-transmissive insulating material.

Embodiment 12

Referring now to FIGS. 12A to 12D, the Embodiment 12 of the present invention is described below in detail.

Figure 12A:
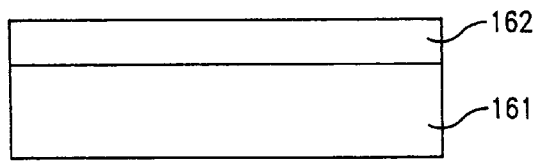

First, as shown in FIG. 12A, a low impurity concentration layer 162 is formed by epitaxial growth according to various thin film growth methods. Alternatively, the surface of the P-type Si monocrystalline substrate 161 is subjected to ion implantation of protons to form an N-type monocrystalline layer 162.

Figure 12B:
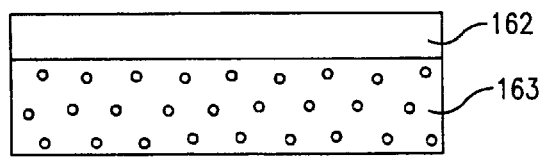

Next, as shown in FIG. 12B, the P-type Si monocrystalline substrate 161 is denatured from the back surface to a porous Si substrate 163 by the anodization method with an HF solution. The porous Si layer 163 can be varied in its density in the range of 1.1 to 0.6 g/cm$^3$ by varying the HF solution concentration to 50 to 20% as compared with the density of the monocrystalline Si of 2.33 g/cm$^3$. The porous layer 163, as described above, is formed on the P-type substrate 163.

Figure 12C:
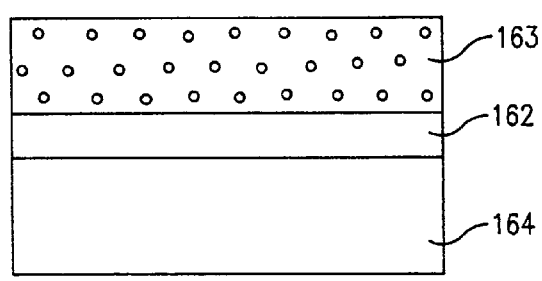

As shown in FIG. 12C, after preparing a light-transmissive substrate 164, onto the surface of the monocrystalline Si layer 162 on the porous Si substrate 163 is bonded the light-transmissive substrate 164. As shown in FIG. 12C, the porous Si substrate 163 is all etched away to have the monocrystalline silicon layer 162 made into a thin film remaining on the light-transmissive substrate 164, thereby forming a semiconductor substrate.

Figure 12D:
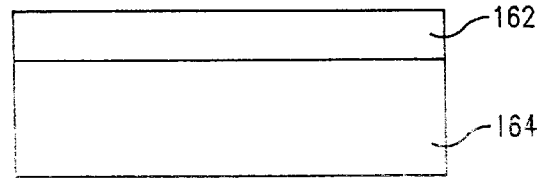

FIG. 12D shows the semiconductor substrate obtained in the present invention. It is the monocrystalline Si layer 162 equal in crystallinity to silicon wafer formed on the light-transmissive substrate 164, flat and yet uniformly into a thin layer, over the whole wafer region with a large area.

The semiconductor substrate thus obtained can be also used suitably also with respect to preparation of an isolation separated electronic device with a light-transmissive insulating material. Also, the semiconductor substrate obtained in the present Embodiment has the same performances as that obtained in Embodiment 1.

Embodiment 13

Figure 13A:
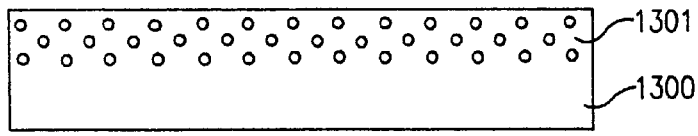
Figure 13B:
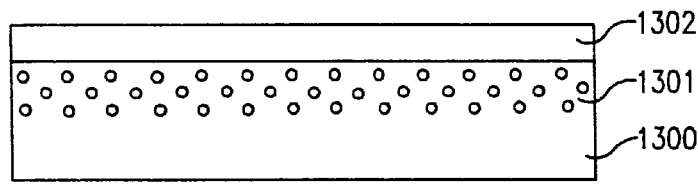
Figure 13C:
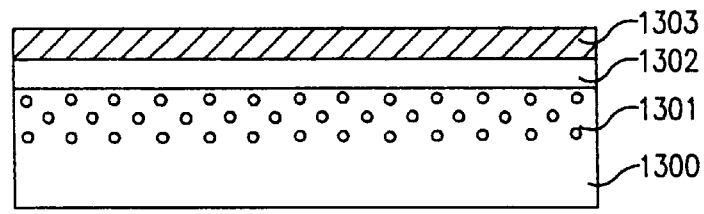

This Embodiment is described by referring to FIGS. 13A to 13F. As shown in FIG. 13A, first a porous region 1301 is formed on a part of an Si monocrystalline substrate 1300. Subsequently, a thin film Si monocrystalline layer 1302 is formed according to various crystal growth methods on the porous region 1301 (FIG. 13B). On the thin film Si monocrystalline layer 1302 is formed an oxidized film 1303 (FIG. 13C).

Figure 13D:
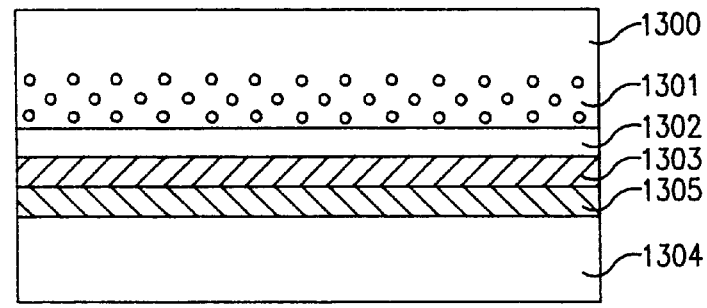

The oxidized film 1305 formed on the surface of another Si substrate 1304 is bonded to the above oxidized film 1303 (FIG. 13D).

Figure 13E:
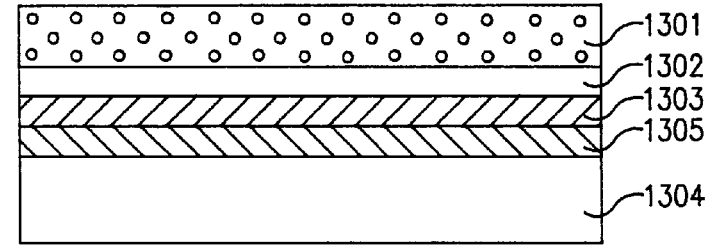

Subsequently, the Si monocrystalline substrate 1300 remaining without being made porous is removed by mechanical polishing or etching to have the porous region 1301 exposed (FIG. 13E).

Figure 13F:
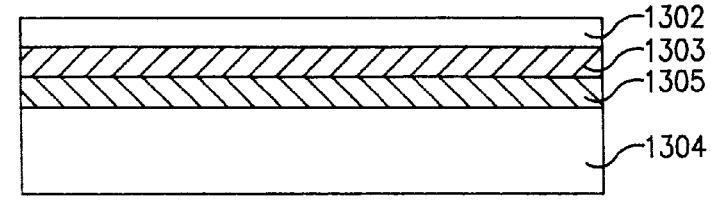

The porous region 1301 is etched away to form a semiconductor substrate having a thin film Si monocrystalline layer on an insulating material (FIG. 13F).

When such step is employed, the time required for making the substrate porous can be shortened and also the time for etching away the porous Si substrate can be shortened, whereby substrate formation can be effected highly efficiently.

It is also possible to bond the thin film Si monocrystalline layer 1302 directly to the oxidized film 1305 without forming the oxidized film 1303 shown in FIG. 13, and it is also possible to bond an insulating substrate such as glass, etc. in place of the oxidized film 1305 formed on the Si substrate 1304.

Also, the respective steps in the Embodiments 1 to 12 can be also incorporated in the present Embodiment.

The semiconductor substrate thus obtained has the same excellent performances as those of the semiconductor substrate obtained in Embodiments 1 to 12.

EXAMPLE 1

A P-type (100) monocrystalline Si substrate (Si wafer) having a diameter of 3 inches and a thickness of 200 microns was anodized in a 50% HF solution. The current density at this time was 100 mA/cm$^2$. The porous structure formation rate at this time was 8.4 $\mu$m/min. and the P-type (100) Si substrate having a thickness of 200 microns as a whole was made porous in 24 minutes.

On the P-type (100) porous Si substrate 21 was grown an Si epitaxial layer to a thickness of 0.5 microns by the MBE (Molecular Beam Epitaxy) method. The deposition conditions are as follows:

Temperature: 700° C.

Pressure: 1×10$^{-9}$ Torr

Growth rate: 0.1 nm/sec.

Next, on the surface of the epitaxial layer 21 was superposed another Si substrate 23 with an oxidized layer of 5000 angstroms formed on the surface, and by heating in a nitrogen atmosphere at 800° C. for 0.5 hour, the two Si substrates were bonded firmly together. Then, the porous Si substrate 21 was chemically etched away by use of hydrofluoric acid-nitric acid-acetic acid solution (1:3:8).

As described above, chemical etching rate of ordinary Si monocrystal relative to hydrofluoric acid-nitric acid-acetic acid solution is about a little lower than 1 micron per minute (hydrofluoric acid-nitric acid-acetic acid solution, 1:3:8), but the chemical etching rate of a porous layer is accelerated by about 100-fold thereof. That is, the Si substrate 21 made porous having a thickness of 200 microns was removed in 2 minutes.

Thus, a monocrystalline Si layer 22 having a thickness of 0.5 $\mu$m could be formed on the SiO$_2$ layer 24.

Also the thickness of the monocrystalline Si layer obtained was examined by use of Scanning Ellipsometer. Specifically, the whole surface of the 3 inches wafer was scanned for the measurement. As the result, within the plane of the 3 inches wafer, the difference between the maximum value and the minimum value of the thickness of the monocrystalline Si layer was found to be suppressed 5% or less relative to the maximum value of the thickness. As the result of plan view observation of the monocrystalline Si layer by transmission electron microscopy, the dislocation defect density was found to be suppressed 1×10$^3$/cm$^2$ or less, whereby it could be confirmed that no new crystal defect had been introduced in the monocrystalline Si layer formation step to maintain good crystallinity. When the life time of minority carriers was measured for the monocrystalline Si layer by use of the MOS C-t method, a high value of 2.0×10$^{-3}$ sec. was exhibited.

EXAMPLE 2

A P-type (100) monocrystalline Si substrate having a diameter of 4 inches and a thickness of 500 microns was anodized in a 50% HF solution. The current density at this time was 100 mA/cm². The porous structure formation rate at this time was 8.4 μm/min. and the P-type (100) Si substrate having a thickness of 500 microns as a whole was made porous in 60 minutes.

On the P-type (100) porous Si substrate 21 was grown at low temperature an Si epitaxial layer 22 to a thickness of 0.5 microns by the plasma CVD method. The deposition conditions are as follows:

Gas: $SiH_4$

Radio frequency power: 100 W

Temperature: 800° C.

Pressure: $1 \times 10^{-2}$ Torr

Growth rate: 2.5 nm/sec.

Next, on the surface of the epitaxial layer 22 was superposed another Si substrate 23 with an oxidized layer 24 of 5000 angstroms formed on the surface, and by heating in a nitrogen atmosphere at 700° C. for 0.5 hour, the two Si substrates were bonded firmly together. Then, the porous Si substrate 21 was chemically etched away by use of hydrofluoric acid-nitric acid-acetic acid solution (1:3:8).

As described above, chemical etching rate of ordinary Si monocrystal relative to hydrofluoric acid-nitric acid-acetic acid solution is about a little lower than 1 micron per minute (hydrofluoric acid-nitric acid-acetic acid solution, 1:3:8), but the chemical etching rate of a porous layer is accelerated by about 100-fold thereof. That is, the Si substrate 21 made porous having a thickness of 500 microns was removed in 5 minutes.

Thus, a monocrystalline Si layer having a thickness of 0.5 μm could be formed on the $SiO_2$ layer 24.

Also the thickness of the monocrystalline Si layer obtained was examined by use of Scanning Ellipsometer. Specifically, the whole surface of the 4 inches wafer was scanned for the measurement. As the result, within the plane of the 4 inches wafer, the difference between the maximum value and the minimum value of the thickness of the monocrystalline Si layer was found to be suppressed 7% or less relative to the maximum value of the thickness. As the result of plan view observation of the monocrystalline Si layer by transmission electron microscopy, the dislocation defect density was found to be suppressed $1 \times 10^3/cm^2$ or less, whereby it could be confirmed that no new crystal defect had been introduced in the monocrystalline Si layer formation step to maintain good crystallinity. When the life time of minority carriers was measured for the monocrystalline Si layer by use of the MOS C-t method, a high value of $2.0 \times 10^{-3}$ sec. was exhibited.

EXAMPLE 3

A P-type (100) monocrystalline Si substrate (Si wafer) having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 21 was grown an Si epitaxial layer 22 to a thickness of 0.5 microns by the bias-sputtering method. The deposition conditions are as follows:

RF frequency: 100 MHz

Radio frequency power: 600 W

Temperature: 300° C.

Ar gas pressure: $8 \times 10^{-3}$ Torr

Growth time: 60 minutes

Target direct current bias: −200 V

Substrate direct current bias: +5 V.

Next, on the surface of the epitaxial layer 22 was superposed another Si substrate 23 with an oxidized layer 24 of 5000 angstroms formed on the surface, and by heating in a nitrogen atmosphere at 800° C. for 0.5 hour, the two Si substrates were bonded firmly together. Then, the porous Si substrate 21 was chemically etched away by use of hydrofluoric acid-nitric acid-acetic acid solution (1:3:8).

As described above, chemical etching rate of ordinary Si monocrystal to hydrofluoric acid-nitric acid-acetic acid solution is about a little lower than 1 micron per minute (hydrofluoric acid-nitric acid-acetic acid solution, 1:3:8), the chemical etching rate of a porous layer is accelerated by about 100fold thereof. That is, the Si substrate 21 made porous having a thickness of 200 microns was removed in 2 minutes.

Thus, a monocrystalline Si layer having a thickness of 0.5 μm could be formed on the $SiO_2$ layer 24.

EXAMPLE 4

A P-type (100) monocrystalline Si substrate having a diameter of 3 inches and a thickness of 200 microns was anodized in a 50% HF solution. The current density at this time was 100 mA/cm².The porous structure formation rate at this time was 8.4 μm/min. and the P-type (100) Si substrate having a thickness of 200 microns as a whole was made porous in 24 minutes.

On the P-type (100) porous Si substrate 21 was grown an Si epltaxial layer 22 to a thickness of 0.5 microns by the liquid phase growth method. The growth conditions are as follows:

Solvent: Sn

Growth temperature: 900° C.

Growth atmosphere: $H_2$

Growth time: 10 minutes.

Next, on the surface of the epitaxial layer 22 was superposed another Si substrate 23 with an oxidized layer 24 of 5000 angstroms formed on the surface, and by heating in a nitrogen atmosphere at 800° C. for 0.5 hour, the two Si substrates were bonded firmly together. Then, the porous Si substrate 21 was chemically etched away by use of hydrofluoric acid-nitric acid-acetic acid solution (1:3:8). As the result, the Si substrate 21 made porous having a thickness of 200 microns was removed in 2 minutes.

Thus, a monocrystalline Si layer 22 having a thickness of 0.5 μm could be formed on the $SiO_2$ layer 24.

EXAMPLE 5

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 21 was grown an Si epitaxial layer 21 to a thickness of 0.5 microns by the low pressure CVD method. The deposition conditions are as follows:

Source gas: $SiH_4$

Carrier gas: $H_2$

Temperature: 850° C.

Pressure: 1×10⁻² Torr

Growth rate: 3.3 nm/sec.

Next, on the surface of the epitaxial layer 22 was superposed another Si substrate with an oxidized layer 24 of 5000 angstroms formed on the surface, and by heating in a nitrogen atmosphere at 800° C. for 0.5 hour, the two Si substrates were bonded firmly together. Then, the porous Si substrate 21 was chemically etched away by use of hydrofluoric acid-nitric acid-acetic acid solution (1:3:8). As the result, the Si substrate 21 made porous having a thickness of 200 microns was removed in 2 minutes.

Thus, a monocrystalline Si layer having a thickness of 0.5 $\mu$m could be formed on the $SiO_2$ layer 24. When $SiH_2Cl_2$ was employed as the source gas, although it was necessary to elevate the growth temperture by some ten degrees, the accelerted etching characteristics inherent in the porous substrate were maintained.

EXAMPLE 6

On a P-type (100) Si substrate 121 having a diameter of 3 inches and a thickness of 200 microns was grown an Si epitaxial layer 122 with a thickness of 1 micron by the CVD method. The deposition conditions are as follows:

Reactive gas flow rate:

$SiH_2Cl_2$ 1000 SCCM $H_2$ 230 l/min.

Temperature: 1080° C.

Pressure: 80 Torr

Time: 2 min.

The substrate 121 was anodized in a 50% HF solution. The current density at this time was 100 mA/cm². The porous structure formation rate at this time was 8.4 $\mu$m/min. and the P-type (100) Si substrate 121 having a thickness of 200 microns as a whole was made porous in 24 minutes. In this anodization, only the P-type (100) Si substrate 121 was wade porous, and there was no change in the Si epitaxial layer 122.

Next, on the surface of the epitaxial layer 122 was superposed another Si substrate 124 with an oxidized layer 125 of 5000 angstroms formed on the surface, and by heating in a nitrogen atmosphere at 800° C. for 0.5 hour, the two Si substrates were bonded firmly together. Then, the porous Si substrate 123 was chemically etched away by use of hydrofluoric acid-nitric acid-acetic acid solution (1:3:8). As the result, the Si substrate 123 made porous having a thickness of 200 microns was removed in 2 minutes.

Also the thickness of the monocrystalline Si layer obtained was examined by use of Scanning Ellipsometer. As the result, within the plane of the 3 inches wafer, the difference between the maximum value and the minimum value of the thickness of the monocrystalline Si layer was found to be suppressed 5% or less relative to the maximum value of the thickness. As the result of plan view observation of the monocrystalline Si layer by transmission electron microscopy, the dislocation defect density was found to be suppressed 1×10³/cm² or less, whereby it could be confirmed that no new crystal defect had been introduced in the monocrystalline Si layer formation step to maintain good crystallinity. When the life time of minority carriers was measured for the monocrystalline Si layer by use of the microwave reflection method, a high value of 2.0×10⁻³ sec. was exhibited.

EXAMPLE 7

On a P-type (100) Si substrate having a diameter of 3 inches and a thickness of 200 microns was grown an Si epitaxial layer 122 to a thickness of 0.5 micron by the CVD method. The deposition conditions are as follows:

Reactive gas flow rate:

$SiH_2Cl_2$ 1000 SCCM $H_2$ 230 l/min.

Temperature: 1080° C.

Pressure: 80 Torr

Tie: 1 min.

The substrate was anodized in a 50% HF solution. The current density at this time was 100 mA/cm². The porous structure formation rate at this time was 8.4 $\mu$m/min. and the P-type (100) Si substrate 121 having a thickness of 200 microns as a whole was made porous in 24 minutes. In this anodization, only the P-type (100) Si substrate was made porous, and there was no change in the Si epitaxial layer 122.

Next, on the surface of the epitaxial layer 122 was superposed another Si substrate 124 with an oxidized layer 125 of 5000 angstroms formed on the surface, and by heating in a nitrogen atmosphere at 800° C. for 0.5 hour, the two Si substrates were bonded firmly together. Then, the porous Si substrate 123 was chemically etched away by use of hydrofluoric acid-nitric acid-acetic acid solution (1:3:8). As the result, the Si substrate 123 made porous having a thickness of 200 microns was removed in 2 minutes.

As the result of cross-sectional observation by transmission electron microscopy, it could be confirmed that no new crystal defect had been introduced in the Si layer 122 to maintain good crystallinity.

EXAMPLE 8

On a surface of a P-type (100) Si substrate 121 having a diameter of 3 inches and a thickness of 200 microns was formed an N-type Si layer 122 to a thickness of 1 micron by ion implantation of protons into the surface. The amount of H⁺ implanted was found to be 5×10₁₅ (ions/cm²). The substrate 121 was anodized in a 50% HF solution. The current density at this time was 100 mA/cm². The porous structure formation rate at this time was 8.4 $\mu$m/min. and the P-type (100) Si substrate 121 having a thickness of 200 microns as a whole was made porous in 24 minutes. As described above, in this anodization, only the P-type (100) Si substrate 121 was made porous, and there was no change in the N-type Si layer 122. Next, on the surface of the N-type Si layer 122 was superposed another Si substrate 124 with an oxidized layer 125 of 5000 angstroms formed on the surface, and by heating in a nitrogen atmosphere at 800° C. for 0.5 hour, the two Si substrates were bonded firmly together. Then, the porous Si substrate 123 was chemically etched away by use of hydrofluoric acid-nitric acid-acetic acid solution (1:3:8). As the result, the Si substrate 123 made porous having a thickness of 200 microns was removed in 2 minutes.

As the result of cross-sectional observation by transmission electron microscopy, it could be confirmed that no new crystal defect had been introduced in the Si layer 122 to maintain good crystallinity.

EXAMPLE 9

A P-type (100) monocrystalline Si substrate having a diameter of 3 inches and a thickness of 200 microns was anodized in a 50% HF solution. The current density at this time was 100 mA/cm². The porous structure formation rate at this time was 8.4 $\mu$m/min. and the P-type (100) Si substrate having a thickness of 200 microns as a whole was made porous in 24 minutes.

On the P-type (100) porous Si substrate 11 was grown an Si epitaxial layer 12 to a thickness of 0.5 microns by the MBE (Molecular Beam Epitaxy) method. The deposition conditions are as follows:

Temperature: 700° C.

Pressure: $1 \times 10^{-9}$ Torr

Growth rate: 0.1 nm/sec.

Next, on the surface of the epitaxial layer 12 was superposed another Si substrate 13 with an oxidized layer 14 of 5000 angstroms formed on the surface, and by heating in a nitrogen atmosphere at 800° C. for 0.5 hour, the two Si substrates were bonded firmly together. Subsequently $Si_3N_4$ was coated on the bonded substrate by the low pressure CVD method to a thickness of 0.1 μm. Thereafter, only the silicon nitride film on the porous substrate was removed by reactive ion etching. Then, the porous Si substrate 11 was chemically etched away by use of hydrofluoric acid-nitric acid-acetic acid solution (1:3:8). As the result, the Si substrate 11 made porous having a thickness of 200 microns was removed in 2 minutes. After removal of the $Si_3N_4$ layer 15, a substrate having a monocrystalline Si layer having a thickness of 0.5 μm on the $SiO_2$ layer 14 could be formed.

As the result of cross-sectional observation by transmission electron microscopy, it could be confirmed that no new crystal defect had been introduced in the Si layer to maintain good crystallinity.

EXAMPLE 10

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes.

On the P-type (100) porous Si substrate 11 was grown an Si epitaxial layer 12 to a thickness of 0.5 microns by the plasma CVD method. The deposition conditions are as follows:

Gas: $SiH_4$

Radio frequency power: 100 W

Temperature: 800° C.

Pressure: 1×10 Torr

Growth rate: 2.5 nm/sec.

Next, on the surface of the epitaxial layer 12 was superposed another Si substrate with an oxidized layer 14 of 5000 angstroms formed on the surface, and by heating in a nitrogen atmosphere at 800° C. for 0.5 hour, the two Si substrates were bonded firmly together. Subsequently, $Si_3N_4$ was coated on the bonded substrate by the low pressure CVD method to a thickness of 0.1 μm. Thereafter, only the silicon nitride film on the porous substrate 11 was removed by reactive ion etching. Then, the porous Si substrate 11 was chemically etched away by use of hydrofluoric acid-nitric acid-acetic acid solution (1:3:8). As the result, the Si substrate 11 made porous having a thickness of 200 microns was removed in 2 minutes. After removal of the Si 3N layer 15, a substrate having a monocrystalline Si layer 12 having a thickness of 0.5 μm on the $SiO_2$ layer could be formed.

Also the thickness of the monocrystalline Si layer obtained was examined by use of Scanning Ellipsometer. As the result, within the plane of the 3 inches wafer, the difference between the maximum value and the minimum value of the thickness of the monocrystalline Si layer was found to be suppressed 5% or less relative to the maximum value of the thickness. As the result of observation by defect delineation etching by use of Sirtle etching, the dislocation defect density was found to be suppressed $1 \times 10^3/cm^2$ or less, whereby it could be confirmed that no new crystal defect had been introduced in the monocrystalline Si layer formation step to maintain good crystallinity. When the life time of minority carriers was measured for the monocrystalline Si layer by use of the MOS C-t method, a high value of $2.0 \times 10^{-3}$ sec. was exhibited.

EXAMPLE 11

A P-type (100) monocrystalline Si substrate having a diameter of 3 inches and a thickness of 200 microns was anodized in a 50% HF solution. The current density at this time was 100 m/cm². The porous structure formation rate at this time was 8.4 μm/min. and the P-type (100) Si substrate having a thickness of 200 microns as a whole was made porous in 24 minutes. On the P-type (100) porous Si substrate 11 was grown an Si epitaxial layer 12 to a thickness of 0.5 microns by the bias sputtering method. The deposition conditions are as follows:

RF frequency: 100 MHz

Radio frequency power: 600 W

Temperature: 300° C.

Ar gas pressure: $8 \times 10^{-3}$ Torr

Growth time: 60 min.

Target direct current bias: −200 V

Substrate direct current bias: +5 V

Next, on the surface of the epitaxial layer 12 was superposed another Si substrate with an oxidized layer 14 of 5000 angstroms formed on the surface, and by heating in a nitrogen atmosphere at 800° C. for 0.5 hour, the two Si substrates were bonded firmly together. Subsequently, $Si_3N_4$ was coated on the bonded substrate by the low pressure CVD method to a thickness of 0.1 μm. Thereafter, only the silicon nitride film on the porous substrate was removed by reactive ion etching. Then, the porous Si substrate 11 was chemically etched away by use of hydrofluoric acid-nitric acid-acetic acid solution (1:3:8). As the result, the Si substrate 11 made porous having a thickness of 200 microns was removed in 2 minutes. After removal of the $Si_3N_4$ layer 15, a substrate having a monocrystalline Si layer 12 having a thickness of 0.5 μm on the $SiO_2$ layer 14 could be formed.

Also, the same effect was obtained when Apiezon Wax was coated in place of the $Si_3N_4$ layer, and only the Si substrate made porous could be completely removed.

EXAMPLE 12

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 11 was grown an Si epitaxial layer 12 to a thickness of 0.5 microns by the liquid phase growth method. The growth conditions are as follows:

Solvent: Sn

Growth temperature: 900° C.

Growth atmosphere: $H_2$

Growth time: 10 min.

Next, on the surface of the epitaxial layer 12 was superposed another Si substrate 13 with an oxidized layer 14 of 5000 angstroms formed on the surface, and by heating in a nitrogen atmosphere at 800° C. for 0.5 hour, the two Si substrates were bonded firmly together. Subsequently, $Si_3N_4$ was coated on the bonded substrate by the low pressure CVD method to a thickness of 0.1 µm. Thereafter, only the silicon nitride film on the porous substrate was removed by reactive ion etching. Then, the porous Si substrate 11 was chemically etched away by use of hydrofluoric acid-nitric acid-acetic acid solution (1:3:8). As the result, the Si substrate 11 made porous having a thickness of 200 microns was removed in 2 minutes. After removal of the $Si_3N_4$ layer 15, a substrate having a monocrystalline Si layer 12 having a thickness of 0.5 µm on the $SiO_2$ layer 14 could be formed.

Also, the same effect was obtained when Apiezon Wax was coated in place of the $Si_3N_4$ layer, and only the Si substrate made porous could be completely removed.

EXAMPLE 13

A P-type (100) monocrystalline Si substrate having a diameter of 3 inches and a thickness of 200 microns was anodized in a 50% HF solution. The current density at this time was 100 mA/$cm^2$. The porous structure formation rate at this time was 8.4 µm/min. and the P-type (100) Si substrate having a thickness of 200 microns as a whole was made porous in 24 minutes. On the P-type (100) porous Si substrate 11 was grown an Si epitaxial layer 12 to a thickness of 0.5 microns by the low pressure CVD method. The deposition conditions are as follows:

Source gas: $SiH_4$

Carrier gas: $H_2$

Temperature: 850° C.

Pressure: $1 \times 10^{-2}$ Torr

Growth rate: 3.3 nm/sec.

Next, on the surface of the epitaxial layer 12 was superposed another Si substrate 13 with an oxidized layer 14 of 5000 angstroms formed on the surface, and by heating in a nitrogen atmosphere at 800° C. for 0.5 hour, the two Si substrates were bonded firmly together. Subsequently, $Si_3N_4$ was coated on the bonded substrate by the low pressure CVD method to a thickness of 0.1 µm. Thereafter, only the silicon nitride film 15 on the porous substrate 11 was removed by reactive ion etching. Then, the porous Si substrate 11 was chemically etched away by use of hydrofluoric acid-nitric acid-acetic acid solution (1:3:8). As the result, the Si substrate 11 made porous having a thickness of 200 microns was removed in 2 minutes. After removal of the $Si_3N_4$ layer 15, a substrate having a monocrystalline Si layer having a thickness of 0.5 µm on the $SiO_2$ layer 14 could be formed.

When $SiH_2Cl_2$ was employed as the source gas, although it was required to elevate the growth temperature by some ten degrees, the accelerated chemical etching characteristics inherent in the porous substrate could be maintained.

EXAMPLE 14

On a P-type (100) Si substrate 111 having a diameter of 3 inches and a thickness of 200 microns was grown an Si epitaxial layer 112 with a thickness of 1 micron by the CVD method. The deposition conditions are as follows:

Reactive gas flow rate:

$SiH_2Cl_2$ 1000 SCCM $H_2$ 230 l/min.

Temperature: 1080° C.

Pressure: 80 Torr

Time: 2 min.

The substrate was anodized in a 50% HF solution. The current density at this time was 100 mA/$cm^2$. The porous structure formation rate at this time was 8.4 µm/min. and the P-type (100) Si substrate 111 having a thickness of 200 microns as a whole was made porous in 24 minutes. In this anodization, only the P-type (100) Si substrate 111 was made porous, and there was no change in the Si epitaxial layer 112. Next, on the surface of the epitaxial layer 112 was superposed another Si substrate 114 with an oxidized layer of 5000 angstroms formed on the surface, and by heating in a nitrogen atmosphere at 800° C. for 0.5 hour, the two Si substrates were bonded firmly together. Subsequently, $Si_3N_4$ was coated on the bonded substrate by the low pressure CVD method to a thickness of 0.1 µm. Thereafter, only the nitride film on the porous substrate was removed by reactive ion etching. Then, the porous Si substrate 111 was chemically etched away by use of hydrofluoric acid-nitric acid-acetic acid solution (1:3:8). As the result, the Si substrate 113 made porous having a thickness of 200 microns was removed in 2 minutes. After removal of the $Si_3N_4$ layer 116, a substrate having a monocrystalline Si layer 112 having a thickness of 1 µm could be formed on $SiO_2$.

Also the thickness of the monocrystalline Si layer obtained was examined by use of Scanning Ellipsometer. As the result, within the plane of the 3 inches wafer, the difference between the maximum value and the minimum value of the thickness of the monocrystalline Si layer was found to be suppressed 5% or less relative to the maximum value of the thickness. As the result of plan view observation of the monocrystalline Si layer by transmission electron microscopy, the dislocation defect density was found to be suppressed $1 \times 10^3/cm^2$ or less, whereby it could be confirmed that no new crystal defect had been introduced in the monocrystalline Si layer formation process to maintain good crystallinity. When the life time of minority carriers was measured for the monocrystalline Si layer by use of the microwave reflection method, a high value of $2.0 \times 10^{-3}$ sec. was exhibited.

EXAMPLE 15

On a P-type (100) Si substrate 111 having a diameter of 3 inches and a thickness of 200 microns was grown an Si epitaxial layer 112 to a thickness of 0.5 micron by the CVD method. The deposition conditions are as follows:

Reactive gas flow rate:

$SiH_2Cl_2$ 1000 SCCM $H_2$ 230 l/min.

Temperature: 1080° C.

Pressure: 80 Torr

Time: 1 min.

The substrate was anodized in a 50% HF solution. The current density at this time was 100 mA/$cm^2$. The porous structure formation rate at this time was 8.4 µm/min. and the P-type (100) Si substrate 111 having a thickness of 200 microns as a whole was made porous in 24 minutes. In this anodization, only the P-type (100) Si substrate 111 was made porous, and there was no change in the Si epitaxial layer 112.

Next, on the surface of the epitaxial layer 112 was superposed an Si substrate 114 with an oxidized layer of 5000 angstroms formed on the surface, and by heating in a nitrogen atmosphere at 800° C. for 0.5 hour, the two Si substrates were bonded firmly together. Subsequently, $Si_3N_4$ was coated on the bonded substrate by the low pressure CVD method to a thickness of 0.1 µm. Thereafter, only the silicon nitride film 116 on the porous substrate 113 was removed by reactive ion etching. Then, the porous Si substrate 113 was chemically etched away by use of hydrofluoric acid-nitric acid-acetic acid solution (1:3:8). As the result, the Si substrate 113 made porous having a thickness of 200 microns was removed in 2 minutes. After removal of the $Si_3N_4$ layer 116, a substrate having a monocrystalline Si layer 112 having a thickness of 0.5 µm could be formed on the $SiO_2$ layer 115. As the result of cross-sectional observation by transmission electron microscopy, it could be confirmed that no new crystal defect had been introduced in the Si layer to maintain good crystallinity.

EXAMPLE 16

On a surface of a P-type (100) Si substrate 111 having a diameter of 3 inches and a thickness of 200 microns was formed an N-type Si layer 112 to a thickness of 1 micron by ion implantation of protons into the surface. The amount of H+implanted was found to be $5\times1015$ (ions/$cm^2$). The substrate was anodized in a 50% HF solution. The current density at this time was 100 mA/$cm^2$. The porous structure formation rate at this time was 8.4 µm/min. and the P-type (100) Si substrate 111 having a thickness of 200 microns as a whole was made porous in 24 minutes. In this anodization, only the P-type (100) Si substrate 111 was made porous, and there was no change in the N-type Si layer 112. Next, on the surface of the N-type Si layer 112 was superposed another Si substrate 114 with an oxidized layer 115 of 5000 angstroms formed on the surface, and by heating in a nitrogen atmosphere at 800° C. for 0.5 hour, the Si substrates were bonded firmly together. Subsequently, $Si_3N_4$ was coated on the bonded substrate by the low pressure CVD method to a thickness of 0.1 µm. Thereafter, only the silicon nitride film on the porous substrate was removed by reactive ion etching. Then, the porous Si substrate 113 was chemically etched away by use of hydrofluoric acid-nitric acid-acetic acid solution (1:3:8). As the result, the Si substrate 113 made porous having a thickness of 200 microns was removed in 2 minutes. After removal of the $Si_3N_4$ layer 116, a substrate having a monocrystalline Si layer 112 having a thickness of 1.0 µm could be formed on the $SiO_2$. As the result of cross-sectional observation by transmission electron microscopy, it could be confirmed that no new crystal defect had been introduced in the Si layer to maintain good crystallinity.

EXAMPLE 17

A P-type (100) monocrystalline Si substrate having a diameter of 3 inches and a thickness of 200 microns was anodized in a 50% HF solution. The current density at this time was 100 mA/$cm^2$. The porous structure formation rate at this time was 8.4 µm/min. and the P-type (100) Si substrate having a thickness of 200 microns as a whole was made porous in 24 minutes.

On the P-type (100) porous Si substrate 31 was grown an Si epitaxial layer 32 to a thickness of 0.5 microns by the MBE (Molecular Beam Epitaxy) method. The deposition conditions are as follows:

Temperature: 700° C.

Pressure: $1\times10^{-9}$ Torr

Growth rate: 0.1 nm/sec.

Next, on the surface of the epitaxial layer 32 was formed an oxide layer 36 with a thickness of 1000 angstroms. Then, on another Si substrate having an oxide layer 34 of 5000 angstroms formed on the surface was superposed the above oxide layer 36, and by heating in a nitrogen atmosphere at 800° C. for 0.5 hour, the both were bonded firmly together. $Si_3N_4$ was coated on the bonded substrate by the low pressure CVD method to a thickness of 0.1 µm. Thereafter, only the silicon nitride film on the porous substrate was removed by reactive ion etching. Then, the porous Si substrate 31 was chemically etched away by use of hydrofluoric acid-nitric acid-acetic acid solution (1:3:8). As the result, the Si substrate 31 made porous having a thickness of 200 microns was removed in 2 minutes. After removal of the $Si_3N_4$ layer 35, a substrate having a thin film monocrystalline Si layer 32 could be formed on the $SiO_2$. As the result of cross-sectional observation by transmission electron microscopy, it could be confirmed that no new crystal defect had been introduced in the Si layer to maintain good crystallinity.

EXAMPLE 18

A P-type (100) monocrystalline Si substrate having a diameter of 3 inches and a thickness of 200 microns was anodized in a 50% HF solution. The current density at this time was 100 mA/$cm^2$. The porous structure formation rate at this time was 8.4 µm/min. and the P-type (100) Si substrate having a thickness of 200 microns as a whole was made porous in 24 minutes. On the P-type (100) porous Si substrate 31 was grown an Si epitaxial layer 32 to a thickness of 5 microns according to the plasma CVD method. The deposition conditions are as follows:

Gas: $SiH_4$

Radio frequency power: 100 W

Temperature: 800° C.

Pressure: $1\times10^{-2}$ Torr

Growth rate: 2.5 nm/sec.

Next, on the surface of the epitaxial layer 32 was formed an oxide layer 36 with a thickness of 1000 angstroms. Then, on another Si substrate 33 having an oxide layer 34 of 5000 angstroms formed on the surface was superposed the above oxide layer 36, and by heating in a nitrogen atmosphere at 800° C. for 0.5 hour, the both were bonded firmly together. $Si_3N_4$ was coated on the bonded substrate by the low pressure CVD method to a thickness of 0.1 µm. Thereafter, only the silicon nitride film on the porous substrate was removed by reactive ion etching. Then, the porous Si substrate 31 was chemically etched away by use of a KOH solution (6 M). As the result, the Si substrate 31 made porous having a thickness of 200 microns was removed in 2 minutes. After removal of the $Si_3N_4$ layer, a substrate having a monocrystalline Si layer 32 with good crystallinity could be formed on the $SiO_2$ layer.

Also the thickness of the monocrystalline Si layer obtained was examined by use of Scanning Ellipsometer. As the result, within the plane of the 3 inches wafer, the difference between the maximum value and the minimum value of the thickness of the monocrystalline Si layer was found to be suppressed 5% or less relative to the maximum value of the thickness. As the result of plan view observation of the monocrystalline Si layer by transmission electron microscopy, the dislocation defect density was found to be suppressed $1\times10^3$/$cm^2$ or less, whereby it could be confirmed that no new crystal defect had been introduced in the monocrystalline Si layer formation process to maintain good crystallinity. When the life time of minority carriers was measured for the monocrystalline Si layer by use of the MOS C-t method, a high value of $2.0\times10^{-3}$ sec. was exhibited.

EXAMPLE 19

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. On the P-type (100) porous Si substrate 31 was grown an Si epitaxial layer 32 to a thickness of 1 micron according to the bias sputtering method. The deposition conditions are as follows:

RF frequency: 100 MHz
Radio frequency power: 600 W
Temperature: 800° C.
Ar gas pressure: 8×10$^{-3}$ Torr
Growth time: 120 min.
Target direct current bias: −200 V
Substrate direct curren bias: +5V Next, on the surface of the epitaxial layer 32 was formed an oxide layer 36 with a thickness of 1000 angstroms. Then, on another Si substrate 33 having an oxide layer 34 of 5000 angstroms formed on the surface was superposed the above oxide layer 36, and by heating in a nitrogen atmosphere at 800° C. for 0.5 hour, the both were bonded firmly together. Si$_3$N$_4$ was coated on the bonded substrate by the low pressure CVD method to a thickness of 0.1 µm. Thereafter, only the nitride film on the porous substrate 31 was removed by reactive ion etching. Then, the porous Si substrate 31 was chemically etched away by use of a hydrofluoric acid-nitric acid-acetic acid solution (1:3:8). As the result, the Si substrate 31 made porous having a thickness of 200 microns was removed in 2 minutes. After removal of the Si$_3$N$_4$ layer, a substrate having a monocrystalline Si layer 32 with good crystallinity could be formed on the SiO$_2$ layer.

The same effect was obtained also when Apiezon Wax was coated in place of the Si$_3$N$_4$ layer 35, whereby only the Si substrate 35 made porous could be completely removed.

EXAMPLE 20

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. On the P-type (100) porous Si substrate 31 was grown an Si epitaxial layer 32 to a thickness of 5 micron by the liquid phase growth method. The growth conditions are as follows:

Solvent: Sn
Growth temperature: 900° C.
Growth atmosphere: H$_2$
Growth time: 10 min.

Next, on the surface of the epitaxial layer 32 was formed an oxide layer 36 with a thickness of 1000 angstroms. Then, on another Si substrate 33 having an oxide layer 34 of 5000 angstroms formed on the surface was superposed the above oxide layer 36, and by heating in a nitrogen atmosphere at 700° C. for 0.5 hour, the both were bonded firmly together. Si$_3$N$_4$ was coated on the bonded substrate by the low pressure CVD method to a thickness of 0.1 µm. Thereafter, only the silicon nitride film on the porous substrate was removed by reactive ion etching. Then, the porous Si substrate 31 was chemically etched away by use of a hydrofluoric acid-nitric acid-acetic acid solution (1:3:8). As the result, the Si substrate 31 made porous having a thickness of 200 microns was removed in 2 minutes. After removal of the Si$_3$N$_4$ layer 35, a substrate having a monocrystalline Si layer 32 could be formed on the SiO$_2$. The same effect was obtained also when Apiezon Wax was coated in place of the Si$_3$N$_4$ layer, whereby only the Si substrate made porous could be completely removed.

Also the thickness of the monocrystalline Si layer obtained was examined by use of Scanning Ellipsometer. As the result, within the plane of the 3 inches wafer, the difference between the maximum value and the minimum value of the thickness of the monocrystalline Si layer was found to be suppressed 5% or less relative to the maximum value of the thickness. As the result of plan view observation of the monocrystalline Si layer by transmission electron microscopy, the dislocation defect density was found to be suppressed 1×10$^3$/cm$^2$ or less, whereby it could be confirmed that no new crystal defect had been introduced in the monocrystalline Si layer formation process to maintain good crystallinity. When the life time of minority carriers was measured for the monocrystalline Si layer by use of the MOS C-t method, a high value of 2.0×10$^{-3}$ sec. was exhibited.

EXAMPLE 21

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. On the P-type (100) porous Si substrate 31 was grown an Si epitaxial layer 32 to a thickness of 1.0 micron at low temperature by the low pressure CVD method. The deposition conditions are as follows:

Source gas: SiH$_4$
Carrier gas: H$_2$
Temperature: 850° C.
Pressure: 1×10$^{-2}$ Torr
Growth rate: 3.3 nm/sec.

Next, on the surface of the epitaxial layer 32 was formed an oxidized layer 36 with a thickness of 1000 angstroms. Then, on another Si substrate 33 having an oxide layer 34 of 5000 angstroms formed on the surface was superposed the above oxide layer 36, and by heating in a nitrogen atmosphere at 700° C. for 0.5 hour, the both were bonded firmly together. Si$_3$N$_4$ was coated on the bonded substrate by the low pressure CVD method to a thickness of 0.1 µm. Thereafter, only the silicon nitride film 35 on the porous substrate 31 was removed by reactive ion etching. Then, the porous Si substrate 31 was chemically etched away by use of a hydrofluoric acid-nitric acid-acetic acid solution (1:3:8). As the result, the Si substrate 31 made porous having a thickness of 200 microns was removed in 2 minutes. After removal of the Si$_3$N$_4$ layer 35, a substrate having a monocrystalline Si layer 32 could be formed on the SiO$_2$ layer.

When SiH$_2$Cl$_2$ was employed as the source gas, although the growth temperature was required to be elevated by some ten degrees, the accelerated chemical etching characteristics inherent in the porous substrate could be maintained.

EXAMPLE 22

On a P-type (100) Si substrate 131 having a diameter of 3 inches and a thickness of 200 microns was grown an Si epitaxial layer 132 with a thickness of 1 micron by the CVD method. The deposition conditions are as follows:

Reactive gas flow rate:

SiH$_2$Cl$_2$ 1000 SCCM

H$_2$ 230 l/min.

Temperature: 1080° C.

Pressure: 80 Torr

Time: 2 min.

The substrate was anodized in a 50% HF solution. The current density at this time was 100 mA/cm$^2$. The porous structure formation rate at this time was 8.4 μm/min. and the P-type (100) Si substrate 131 having a thickness of 200 microns as a whole was made porous in 24 minutes. As described above, only the P-type (100) Si substrate 131 was made porous in this anodization, and there was no change in the Si epitaxial layer 132. Next, on the surface of the epitaxial layer 132 was formed an oxidized layer 137, another Si substrate 134 having an oxidized layer 135 of 5000 angstroms formed on the surface was superposed on the above oxidized layer 137, and the two Si substrates were bonded together firmly by heating at 800° C. for 0.5 hour in a nitrogen atmosphere. By the low pressure CVD method, Si$_3$N$_4$ was coated with a thickness of 0.1 μm on the bonded substrate. Then only the silicon nitride film on the porous substrate was removed by reactive ion etching. Subsequently, the porous Si substrate 133 was chemically etched away by use of hydrofluoric acid-nitric acid-acetic acid solution (1:3:8). As the result, the Si substrate 133 made porous having a thickness of 200 microns was removed in 2 minutes. After removal of the Si$_3$N$_4$ layer 136, a substrate having the monocrystalline Si layer 132 having a thickness of 1 μm could be formed on SiO$_2$.

As the result of cross-sectional observation by transmission electron microscopy, it was confirmed that no new crystal defect had been introduced in the Si layer to maintain good crystallinity.

EXAMPLE 23

On a P-type (100) Si substrate 131 having a diameter of 4 inches and a thickness of 500 microns was grown an Si epitaxial layer 132 with a thickness of 0.5 micron by the CVD method. The deposition conditions are as follows:

Reactive gas flow rate:

SiH$_2$Cl$_2$ 1000 SCCM

H$_2$ 230 l/min.

Temperature: 1080° C.

Pressure: 80 Torr

Time: 1 min.

The substrate was anodized in a 50% HF solution. The current density at this time was 100 mA/cm$^2$. The porous structure formation rate at this time was 8.4 μm/min. and the P-type (100) Si substrate 131 having a thickness of 500 microns as a whole was made porous. Only the P-type (100) Si substrate 131 was made porous in this anodization, and there was no change in the Si epitaxial layer 132.

Next, on the surface of the epitaxial layer 132 was formed an oxidized layer 137 with a thickness of 1000 angstroms. Then, another Si substrate 134 having an oxidized layer 135 of 5000 angstroms formed on the surface was adhered on the above oxidized layer 137, and the both were bonded together firmly by heating at 700° C. for 0.5 hour in a nitrogen atmosphere. By the low pressure CVD method, Si$_3$N$_4$ was coated with a thickness of 0.1 μm on the bonded substrate, and only the silicon nitride film 136 on the porous substrate 133 was removed by reactive ion etching. Then, the porous Si substrate was chemically etched away by use of hydrofluoric acid-nitric acid-acetic acid solution (1:3:8). As the result, the Si substrate made porous having a thickness of 500 microns was removed in 5 minutes. After removal of the Si$_3$N$_4$ layer 136, a substrate having the monocrystalline Si layer 132 could be formed on SiO$_2$.

Also the thickness of the monocrystalline Si layer obtained was examined by use of Scanning Ellipsometer. As the result, within the plane of the 4 inches wafer, the difference between the maximum value and the minimum value of the thickness of the monocrystalline Si layer was found to be suppressed 8% or less relative to the maximum value of the thickness. As the result of plan view observation of the monocrystalline Si layer by transmission electron microscopy, the dislocation defect density was found to be suppressed $1 \times 10^3$/cm$^2$ or less, whereby it could be confirmed that no new crystal defect had been introduced in the monocrystalline Si layer formation process to maintain good crystallinity. When the life time of minority carriers was measured for the monocrystalline Si layer by use of the MOS C-t method, a high value of $2.1 \times 10^{-3}$ sec. was exhibited.

EXAMPLE 24

On the surface of a P-type (100) Si substrate 131 having a diameter of 3 inches and a thickness of 200 microns was formed N-type Si layer 132 with a thickness of 1 micron by ion implantation of protons. The amount of H$^+$ implanted was $5 \times 10^{15}$ (ions/cm$^2$). The substrate was anodized in a 50% HF solution. The current density at this time was 100 mA/cm$^2$. The porous structure formation rate at this time was 8.4 μm/min. and the P-type (100) Si substrate 131 having a thickness of 200 microns as a whole was made porous in 24 minutes. Only the P-type (100) Si substrate 131 was made porous in this anodization, and there was no change in the N-type Si layer 132. Next, on the surface of the epitaxial layer 132 was formed an oxidized layer 137 with a thickness of 1000 angstroms. Then, another Si substrate 134 having an oxidized layer 135 of 5000 angstroms formed on the surface was adhered on the above oxidized layer 137, and the two Si substrates were bonded together firmly by heating at 700° C. for 0.5 hour. By the low pressure CVD method, Si$_3$N$_4$ was coated with a thickness of 0.1 μm on the bonded substrate. Then, only the silicon nitride film on the porous substrate was removed by reactive ion etching. Subsequently, the porous Si substrate 133 was chemically etched away by use of hydrofluoric acid-nitric acid-acetic acid solution (1:3:8). As the result, the Si substrate made porous having a thickness of 200 microns was removed in 2 minutes. After removal of the Si$_3$N$_4$ layer 136, a substrate having the monocrystalline Si layer 132 could be formed on SiO$_2$. As the result of cross-sectional observation by transmission electron microscopy, it was confirmed that no new crystalline defect had been introduced in the Si layer to maintain good crystallinity.

EXAMPLE 25

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes.

On the P-type (100) porous Si substrate 41 was grown an Si epitaxial layer 42 to a thickness of 0.5 microns by the MBE (Molecular Beam Epitaxy) method. The deposition conditions are as follows:

Temperature: 700° C.

Pressure: $1\times10^{-9}$ Torr

Growth rate: 0.1 nm/sec.

Next, on the surface of the epitaxial layer 42 was formed an oxidized layer 45 with a thickness of 1000 angstroms. Then, another Si substrate 43 with an oxidized layer 44 of 5000 angstroms formed on the surface was superposed on the above oxidized layer 45, and by heating in a nitrogen atmosphere at 800° C. for 0.5 hour, the two Si substrates were bonded firmly together. Then, the porous Si substrate 41 was chemically etched away by use of hydrofluoric acid-nitric acid-acetic acid solution (1:3:8). As the result, the Si substrate 41 made porous having a thickness of 200 microns was removed in 2 minutes.

Thus, a substrate having a thin film monocrystalline Si layer 42 could be formed on the $SiO_2$. As the result of cross-sectional observation by transmission electron microscopy, it was confirmed that no new crystal defect had been introduced in the Si layer to maintain good crystallinity.

EXAMPLE 26

A P-type (100) monocrystalline Si substrate having a diameter of 3 inches and a thickness of 200 microns was anodized in a 50% HF solution. The current density at this time was 100 $mA/cm^2$. The porous structure formation rate at this time was 8.4 $\mu m/min$. and the P-type (100) Si substrate having a thickness of 200 microns as a whole was made porous in 24 minutes. On the P-type (100) porous Si substrate 41 was grown an Si epitaxial layer 42 to a thickness of 5 microns by the plasma CVD method. The deposition conditions are as follows:

Gas: $SiH_4$

Radio frequency power: 100 W Temperature: 800° C.

Pressure: $1\times10^{-2}$ Torr

Growth rate: 2.5 nm/sec.

Next, on the surface of the epitaxial layer 42 was formed an oxidized layer 45 with a thickness of 1000 angstroms. Then, another Si substrate 43 with an oxidized layer 44 of 5000 angstroms formed on the surface was superposed on the above oxidized layer 45, and by heating in a nitrogen atmosphere at 800° C. for 0.5 hour, the two Si substrates were bonded firmly together. Then, the porous Si substrate 41 was chemically etched away by use of a KOH solution of 6 M.

As described above, ordinary chemical etching rate of Si monocrystal relative to 6M KOH solution is about a little lower than 1 micron per minute, but the chemical etching rate of a porous layer is accelerated by about 100-fold thereof. Then, the Si substrate made porous having a thickness of 200 microns was removed in 2 minutes.

Thus, a monocrystalline Si layer having good crystallinity could be formed on the $SiO_2$.

EXAMPLE 27

A P-type (100) monocrystalline Si substrate having a diameter of 5 inches and a thickness of 600 microns was anodized in a 50% HF solution. The current density at this time was 100 $mA/cm^2$. The porous structure formation rate at this time was 8.4 $\mu m/min$. and the P-type (100) Si substrate having a thickness of 600 microns as a whole was made porous in 70 minutes. On the P-type (100) porous Si substrate 41 was grown an Si epitaxial layer 42 to a thickness of 1 micron by the bias-sputtering method. The deposition conditions are as follows:

RF frequency: 100 MHz

Radio frequency power: 600 w

Temperature: 300° C.

Ar gas pressure: $8\times10^{-3}$ Torr

Growth time: 120 minutes

Target direct current bias: −200 V

Substrate direct current bias: +5 V.

Next, on the surface of the epitaxial layer 42 was formed an oxidized layer 45 with a thickness of 1000 angstroms. Then, another Si substrate 43 with an oxidized layer 44 of 5000 angstroms formed on the surface was superposed on the above oxidized layer 45, and by heating in a nitrogen atmosphere at 800° C. for 0.5 hour, the two Si substrates were bonded firmly together. Then, the porous Si substrate 41 was chemically etched away by use of hydrofluoric acid-nitric acid-acetic acid solution (1:3:8). As the result, the Si substrate 41 made porous having a thickness of 600 microns was removed in 7 minutes.

Thus, a substrate having a monocrystalline Si layer 42 with good crystallinity could be formed on the $SiO_2$.

Also the thickness of the monocrystalline Si layer obtained was examined by use of Scanning Ellipsometer. As the result, within the plane of the 5 inches wafer, the difference between the maximum value and the minimum value of the thickness of the monocrystalline Si layer was found to be suppressed 8% or less based on the maximum value of the thickness. As the result of plan view observation of the monocrystalline Si layer by transmission electron microscopy, the dislocation defect density was found to be suppressed $1\times10^3/cm^2$ or less, whereby it could be confirmed that no new crystal defect had been introduced in the monocrystalline Si layer formation step to maintain good crystallinity. When the life time of minority carriers was measured for the monocrystalline Si layer by use of the MOS C-t method, a high value of $2.1\times10^{-3}$ sec. was exhibited.

EXAMPLE 28

A P-type (100) monocrystalline Si substrate having a diameter of 3 inches and a thickness of 200 microns was anodized in a 50% HF solution. The current density at this time was 100 $mA/cm^2$. The porous structure formation rate at this time was 8.4 $\mu m/min$. and the P-type (100) Si substrate having a thickness of 200 microns as a whole was made porous in 24 minutes. On the P-type (100) porous Si substrate 41 was grown an Si epitaxial layer 42 to a thickness of 5 microns by the liquid phase growth method. The growth conditions are as follows:

Solvent: Sn

Growth temperature: 900° C.

Growth atmosphere: $H_2$

Growth time: 10 minutes.

Next, on the surface of the epitaxial layer 42 was formed an oxidized layer 45 with a thickness of 1000 angstroms. Then, another Si substrate 43 having an oxidized layer 44 of 5000 angstroms formed on the surface was closely contacted, and by heating in a nitrogen atmosphere at 700° C. for 0.5 hour, the two Si substrates were bonded firmly together. Then, the porous Si substrate 41 was chemically etched away by use of hydrofluoric acid-nitric acid-acetic acid solution (1:3:8). As the result, the Si substrate 41 made porous having a thickness of 200 microns was removed in 2 minutes.

Thus, a substrate having a monocrystalline Si layer could be formed on the $SiO_2$.

EXAMPLE 29

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. On the P-type (100) porous Si substrate 41 was grown an Si epitaxial layer 42 to a thickness of 1.0 microns by to the low pressure CVD method. The deposition conditions are as follows:

Source gas: SiH$_4$
Carrier gas: H$_2$
Temperature: 850° C.
Pressure: 1×10$^{-2}$ Torr
Growth rate: 3.3 nm/sec.

Next, on the surface of the epitaxial layer 42 was formed an oxidized layer 45 with a thickness of 1000 angstroms. Then, another Si substrate 43 having an oxidized layer 44 of 5000 angstroms on the surface was closely contacted, and by heating in a nitrogen atmosphere at 700° C. for 0.5 hour, the two Si substrates were bonded firmly together. Subsequently, the porous Si substrate 41 was chemically etched away by use of hydrofluoric acid-nitric acid-acetic acid solution (1:3:8). As the result, the Si substrate 41 made porous having a thickness of 200 microns was removed in 2 minutes.

Thus, a substrate having a monocrystalline Si layer 42 on SiO$_2$ could be formed. When SiH$_2$Cl$_2$ was employed, although it was necessary to elevate the growth temperature by some ten degrees, the accelerated chemical etching characteristics inherent in the porous substrate were maintained.

EXAMPLE 30

On a P-type (100) Si substrate 141 having a diameter of 3 inches and a thickness of 200 microns was grown an Si epitaxial layer 142 with a thickness of 1 micron by the CVD method. The deposition conditions are as follows:

Reactive gas flow rate:
SiH$_2$Cl$_2$ 1000 SCCM
H$_2$ 230 l/min.
Temperature: 1080° C.
Pressure: 80 Torr
Time: 2 min.

The substrate was anodized in a 50% HF solution. The current density at this time was 100 mA/cm$^2$. The porous structure formation rate at this time was 8.4 μm/min. and the P-type (100) Si substrate having a thickness of 200 microns as a whole was made porous. Only the P-type (100) Si substrate 141 was made porous in this anodization, and there was no change in the Si epitaxial layer 142. Next, on the surface of the epitaxial layer 142 was superposed another Si substrate 144 having an oxidized layer 145 of 5000 angstroms formed on the surface, and the two Si substrates were bonded together firmly by heating at 800° C. for 0.5 hour in a nitrogen atmosphere. Subsequently, the porous Si substrate was chemically etched away by use of hydrofluoric acid-nitric acid-acetic acid solution (1:3:8). As the result, the Si substrate made porous having a thickness of 200 microns was removed in 2 minutes.

Thus, a substrate having a monocrystalline layer 142 with a thickness of 1 μm on SiO$_2$ could be formed. As the result of cross-sectional observation by a transmission electron microscopy, it was confirmed that no new crystal defect had been introduced in the Si layer to maintain good crystallinity.

EXAMPLE 31

On a P-type (100) Si substrate 141 having a diameter of 3 inches and a thickness of 200 microns was grown an Si epitaxial layer 142 with a thickness of 0.5 micron by the CVD method. The deposition conditions are as follows:

Reactive gas flow rate:
SiH$_2$Cl$_2$ 1000 SCCM
H$_2$ 230 l/min.
Temperature: 1080° C.
Pressure: 80 Torr
Time: 1 min.

The substrate was anodized in a 50% HF solution. The current density at this time was 100 mA/cm$^2$. The porous structure formation rate at this time was 8.4 μm/min. and the P-type (100) Si substrate 141 having a thickness of 200 microns as a whole was made porous in 24 minutes. Only the P-type (100) Si substrate 141 was made porous in this anodization, and there was no change in the Si epitaxial layer 142.

Next, on the surface of the epitaxial layer 142 was formed an oxidized layer 146 with a thickness of 1000 angstroms. Then, another Si substrate having an oxidized layer 145 of 5000 angstroms formed on the surface was closely contacted, and the two Si substrates were bonded together firmly by heating at 700° C. for 0.5 hour. Then, the porous Si substrate was chemically etched away by use of hydrofluoric acid-nitric acid-acetic acid solution (1:3:8). As the result, the Si substrate made porous having a thickness of 200 microns was removed in 2 minutes.

Thus, a substrate having a monocrystalline Si layer on SiO$_2$ could be formed. As the result of cross-sectional observation by transmission electron microscopy, it was confirmed that no new crystal defect had been introduced in the Si layer to maintain good crystallinity.

EXAMPLE 32

On the surface of a P-type (100) Si substrate 141 having a diameter of 3 inches and a thickness of 200 microns was formed an N-type Si layer 142 with a thickness of 1 micron by ion implantation of protons. The amount of H$^+$ implanted was 5×10$^{15}$ (ions/cm$^2$). The substrate was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. Only the P-type (100) Si substrate 141 was made porous in this anodization, and there was no change in the N-type Si layer 142. Next, on the surface of the epitaxial layer 142 was formed an oxidized layer 146 with a thickness of 1000 angstroms. Then, another Si substrate having an oxidized layer 145 of 5000 angstroms formed on the surface was closely contacted with the above oxidized layer 146, and the two Si substrates were bonded together firmly by heating at 700° C. for 0.5 hour. Subsequently, the porous Si substrate was chemically etched away by use of hydrofluoric acid-nitric acid-acetic acid solution (1:3:8). As the result, the Si substrate made porous having a thickness of 200 microns was removed in 2 minutes.

A substrate having a monocrystalline Si layer on SiO$_2$ could be formed.

Also the thickness of the monocrystalline Si layer obtained was examined by use of Scanning Ellipsometer. As the result, within the plane of the 3 inches wafer, the difference between the maximum value and the minimum value of the thickness of the monocrystalline Si layer was found to be suppressed 5% or less based on the maximum value of the thickness.

As the result of plan-view observation of the monocrystalline Si layer by a transmission electron microscopy, the dislocation defect density was found to be suppressed $1 \times 10^3/cm^2$ or less, whereby it could be confirmed that no new crystal defect had been introduced in the monocrystalline Si layer formation step to maintain good crystallinity. When the life time of minority carriers was measured for the monocrystalline layer by use of the MOS C-t method, a high value of $2.2 \times 10^{-3}$ sec. was exhibited.

EXAMPLE 33

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes.

On the P-type (100) porous Si substrate 51 was grown an Si epitaxial layer 52 to a thickness of 0.5 microns at a low temperature by the MBE method. The deposition conditions are as follows:

Temperature: 700° C.

Pressure: $1 \times 10^{-9}$ Torr

Growth rate: 0.1 nm/sec.

Next, on the surface of the epitaxial layer 52 was superposed a fused silica substrate applied with optical polishing, and by heating in a nitrogen atmosphere at 800° C. for 0.5 hour, the two substrates were bonded firmly together. By the low pressure CVD method, Si$_3$N$_4$ was coated on the bonded substrate with a thickness of 0.1 µm. Subsequently, only the nitride film 54 on the porous substrate 51 was removed by reactive ion etching. Then, the porous Si substrate 51 was chemically etched away by use of hydrofluoric acid-nitric acid-acetic acid solution (1:3:8). As the result, the Si substrate 51 made porous having a thickness of 200 microns was removed in 2 minutes. After removal of the Si$_3$N$_4$ layer 54, a substrate having the monocrystalline Si layer 52 with a thickness of 0.5 pa on the fused silica 53 could be obtained.

As the result of cross-sectional observation by transmission electron microscopy, it was confirmed that no new crystal defect had been introduced in the Si layer to maintain good crystallinity.

EXAMPLE 34

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. On the P-type (100) porous Si substrate 51 was grown an Si epitaxial layer 52 to a thickness of 5 microns by the plasma CVD method. The deposition conditions are as follows:

Gas: SiH$_4$

Radio frequency power: 100 W

Temperature: 800° C.

Pressure: $1 \times 10^{-2}$ Torr

Growth rate: 2.5 nm/sec.

Next, on the surface of the epitaxial layer 52 was superposed a glass substrate having a softening point around 500° C. applied with optical polishing, and by heating in a nitrogen atmosphere at 450° C. for 0.5 hour, the two substrates were bonded firmly together. By the low pressure CVD method, Si$_3$N$_4$ was coated on the bonded substrate with a thickness of 0.1 µm. Subsequently, only the nitride film 54 on the porous substrate 51 was removed by reactive ion etching. Then, the porous Si substrate was chemically etched away by use of 6M KOH solution. As the result, the Si substrate made porous having a thickness of 200 microns was removed in 2 minutes. After removal of the Si$_3$N$_4$ layer, the monocrystalline layer 52 with a thickness of 5 µm on the low softening glass substrate 53 could be obtained.

EXAMPLE 35

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 µm/min. and the P-type (100) Si substrate having a thickness of 200 microns as a whole was made porous in 24 minutes. On the P-type (100) porous Si substrate 51 was grown an Si epitaxial layer to a thickness of 1.0 micron by the bias-sputtering method. The deposition conditions are as follows:

RF frequency: 100 MHz

Radio frequency power: 600 W

Temperature: 300° C.

Ar gas pressure: $8 \times 10^{-3}$ Torr

Growth time: 120 minutes

Target direct current bias: −200 V

Substrate direct current bias: +5 V.

Next, on the surface of the epitaxial layer 52 was superposed a glass substrate 53 having a softening point around 500° C. applied with optical polishing, and by heating in a nitrogen atmosphere at 450° C. for 0.5 hour, the two substrate were bonded firmly together. By the low pressure CVD method, Si$_3$N$_4$ was coated on the bonded substrate with a thickness of 0.1 µm. Subsequently, only the nitride film on the porous substrate was removed by reactive ion etching. Then, the porous Si substrate was chemically etched away by use of hydrofluoric acid-nitric acid-acetic acid solution (1:3:8). As the result, the Si substrate 51 made porous having a thickness of 200 microns was removed in 2 minutes. After removal of the Si$_3$N$_4$ layer 54, a substrate having the monocrystalline layer 52 with a thickness of 1.0 µm on the low melting point glass could be obtained. The same effect could be also obtained when Apiezon Wax was coated in place of the Si$_3$N$_4$ layer, and only the Si substrate 51 made porous could be removed.

Also the thickness of the monocrystalline Si layer obtained was examined by use of Scanning Ellipsometer. As the result, within the plane of the 3 inches wafer, the difference between the maximum value and the minimum value of the thickness of the monocrystalline Si layer was found to be suppressed 5% or less based on the maximum value of the thickness. As the result of plan-view observation of the monocrystalline Si layer by a transmission electron microscopy, the dislocation defect density was found to be suppressed $1 \times 10_3/cm^2$ or less, whereby it could be confirmed that no new crystal defect had been introduced in the monocrystalline Si layer formation step to maintain good crystallinity. When the life time of minority carriers was measured for the monocrystalline Si layer by use of the MOS C-t method, a high value of $2.0 \times 10^{-3}$ sec. was exhibited.

EXAMPLE 36

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. On the P-type (100) porous Si substrate 51 was grown an Si epitaxial layer to a thickness of 10 microns by the liquid phase growth method. The growth conditions are as follows:

Solvent: Sn
Growth temperature: 900° C.
Growth atmosphere: H$_2$
Growth time: 20 minutes.

Next, on the surface of the epitaxial layer 52 was superposed a glass substrate 53 having a softening point around 800° C. applied with optical polishing, and by heating in a nitrogen atmosphere at 750° C. for 0.5 hour, the two substrates were bonded firmly together. By the low pressure CVD method, Si$_3$N$_4$ was coated on the bonded substrate with a thickness of 0.1 μm. Subsequently, only the nitride film on the porous substrate was removed by reactive ion etching. Then, the porous Si substrate was chemically etched away by use of hydrofluoric acid-nitric acid-acetic acid solution (1:3:8). As the result, the Si substrate 51 made porous having a thickness of 200 microns was removed in 2 minutes. After removal of the Si$_3$N$_4$ layer 54, a substrate having the monocrystalline Si layer 52 with a thickness of 10 μm on the glass 53 could be obtained. The same effect could be also obtained when Apiezon Wax was coated in place of the Si$_3$N$_4$ layer, and only the Si substrate made porous could be completely removed.

EXAMPLE 37

A P-type (100) monocrystalline Si substrate having a diameter of 3 inches and a thickness of 200 microns was anodized in a 50% HF solution. The current density at this time was 100 mA/cm$^2$. The porous structure formation rate at this time was 8.4 μm/min. and the P-type (100) Si substrate having a thickness of 200 microns as a whole was made porous in 24 minutes. On the P-type (100) porous Si substrate 51 was grown an Si epitaxial layer 52 to a thickness of 1.0 micron by the low pressure CVD method. The deposition conditions are as follows:

Source gas: SiH$_4$ 800 SCCM
Carrier gas: H$_2$ 150 l/min.
Temperature: 850° C.
Pressure: $1 \times 10_{-2}$ Torr
Growth rate: 3.3 nm/sec.

Next, on the surface of the epitaxial layer 52 was superposed a fused silica substrate 53 applied with optical polishing, and by heating in a nitrogen atmosphere at 800° C. for 0.5 hour, the two Si substrates were bonded firmly together.

By the low pressure CVD method, Si$_3$N$_4$ was coated on the bonded substrate with a thickness of 0.1 μm. Subsequently, only the nitride film on the porous substrate was removed by reactive ion etching. Then, the porous Si substrate 51 was chemically etched away by use of hydrofluoric acid-nitric acid-acetic acid solution. As the result, the Si substrate 51 made porous having a thickness of 200 microns was removed in 2 minutes. After removal of the Si$_3$N$_4$ layer, a substrate having the monocrystalline Si layer 52 with a thickness of 1.0 μm on the fused silica substrate 53 could be formed.

When SiH$_2$Cl$_2$ as the source gas was employed, although it was necessary to elevate the growth temperature by some ten degrees, the accelerated chemical etching characteristics inherent in the porous substrate were maintained.

EXAMPLE 38

On a P-type (100) Si substrate 151 having a diameter of 4 inches and a thickness of 300 microns was grown an Si epitaxial layer 152 with a thickness of 1 micron by the CVD method. The deposition conditions are as follows:

Reactive gas flow rate:
SiH$_2$Cl$_2$ 1000 SCCM
H$_2$ 230 l/min.
Temperature: 1080° C.
Pressure: 80 Torr
Time: 2 min.

The substrate was anodized in a 50% HF solution. The current density at this time was 100 mA/cm$^2$. The porous structure formation rate at this time was 8.4 μm/min. and the P-type (100) Si substrate 151 having a thickness of 300 microns as a whole was made porous in 36 minutes. As described above, only the P-type (100) Si substrate 151 was made porous in this anodization, and there was no change in the Si epitaxial layer 152. Next, on the surface of the epitaxial layer 152 was superposed a fused silica substrate 154 applied with optical polishing, and the two substrate were bonded together firmly by heating at 800° C. for 0.5 hour in a nitrogen atmosphere. By the low pressure CVD method, Si$_3$N$_4$ was deposited with a thickness of 0.1 μm to be coated on the bonded substrate. Subsequently the nitride film 155 on the porous substrate 153 was removed by reactive ion etching. Then, the porous Si substrate was chemically etched away by use of hydrofluoric acid-nitric acid-acetic acid solution (1:3:8). As the result, the Si substrate 153 made porous having a thickness of 300 microns was removed in 4 minutes. After removal of the Si$_3$ N$_4$ layer 155, a substrate having the monocrystalline Si layer 152 having a thickness of 1 μm on the fused silica substrate 154 could be formed.

As the result of cross-sectional observation by transmission electron microscopy, it was confirmed that no new crystal defect had been introduced in the Si layer to maintain good crystallinity.

EXAMPLE 39

On a P-type (100) Si substrate 151 having a diameter of 3 inches and a thickness of 200 microns was grown an Si epitaxial layer 152 with a thickness of 0.5 micron by the CVD method. The deposition conditions are as follows:

Reactive gas flow rate:
SiH$_2$Cl$_2$ 1000 SCCM
H$_2$ 230 l/min.
Temperature: 1080° C.
Pressure: 80 Torr
Time: 1 min.

The substrate was anodized in a 50% HF solution. The current density at this time was 100 mA/cm$^2$. The porous structure formation rate at this time was 8.4 μm/min. and the P-type (100) Si substrate 151 having a thickness of 200 microns as a whole was made porous in 24 minutes. Only the P-type (100) Si substrate was made porous in this anodization, and there was no change in the Si epitaxial layer 152.

Next, on the surface of the epitaxial layer 152 was superposed a fused silica substrate 154 applied with optical polishing, and the two substrates were bonded together firmly by heating at 800° C. for 0.5 hour. By the low pressure CVD method, $Si_3N_4$ was deposited with a thickness of 0.1 μm to be coated on the bonded substrate. Subsequently the nitride film 155 on the porous substrate 153 was removed by reactive ion etching. Then, the porous Si substrate was chemically etched away by use of hydrofluoric acid-nitric acid-acetic acid solution (1:3:8). As the result, the Si substrate 153 made porous having a thickness of 200 microns was removed in 2 minutes. After removal of the $Si_3N_4$ layer 155, a substrate having the monocrystalline Si layer 152 having a thickness of 0.5 μm on the fused silica 154 could be formed. As the result of cross-sectional observation by transmission electron microscopy, it was confirmed that no new crystal defect had been introduced in the Si layer to maintain good crystallinity.

EXAMPLE 40

On the surface of a P-type (100) Si substrate 151 having a diameter of 4 inches and a thickness of 300 microns was formed an N-type Si layer 152 with a thickness of 1 micron by ion implantation of protons. The amount of H+ implanted was $5 \times 10^{15}$ (ions/cm ). The substrate was anodized in a 50% HF solution. The current density at this time was 100 $mA/cm^2$. The porous structure formation rate at this time was 8.4 μm/min. and the P-type (100) Si substrate 151 having a thickness of 300 microns as a whole was made porous in 37 minutes. Only the P-type (100) Si substrate was made porous in this anodization, and there was no change in the N-type Si layer 152. Next, on the surface of the N-type Si layer 152 was superposed a fused silica substrate 154 with optical polishing, and the two substrates were bonded together firmly by heating at 800° C. for 0.5 hour in a nitrogen atmosphere. By the low pressure CVD method, $Si_3N_4$ was deposited to a thickness of 0.1 μm to be coated on the bonded substrate. Subsequently, only the nitride film 155 on the porous substrate 153 was removed by reactive ion etching. Then, the porous Si substrate was chemically etched away by use of hydrofluoric acid-nitric acid-acetic acid solution. As the result, the Si substrate 151 made porous having a thickness of 300 microns was removed in 4 minutes. After removal of the $Si_3N_4$ layer 155, a substrate having the monocrystalline Si layer 152 with a thickness of 1.0 μm on the fused silica 154 could be formed.

Also the thickness of the monocrystalline Si layer obtained was examined by use of Scanning Ellipsometer. As the result, within the plane of the 4 inches wafer, the difference between the maximum value and the minimum value of the thickness of the monocrystalline Si layer was found to be suppressed 6% or less based on the maximum value of the thickness. As the result of plan-view observation of the monocrystalline Si layer by transmission electron microscopy, the dislocation defect density was found to be suppressed $1 \times 10^3/cm^2$ or less, whereby it could be confirmed that no new crystal defect had been introduced in the monocrystalline Si layer formation step to maintain good crystallinity. When the life time of minority carriers was measured for the monocrystalline Si layer by use of the MOS C-t method, a high value of $2.2 \times 10$ sec. was exhibited.

In short, according to the present invention, in obtaining an Si crystalline layer excellent in crystallinity equal to monocrystalline Si wafer also on a light-transparent insulating material substrate represented by glass, a process for forming a semiconductor substrate excellent in aspects of productivity, uniformity, controllability, economy can be provided. Further, according to the present invention, there can be provided a process for forming a semiconductor substrate broad in scope of application which can make available the advantages of the SOI device of the over the prior art.

EXAMPLE 41

A P-type (100) monocrystalline Si substrate having a diameter of 3 inches and a thickness of 200 microns was anodized in a 50% HF solution. The current density at this time was 100 $mA/cm^2$. The porous structure formation rate at this time was 8.4 μm/min. and the P-type (100) Si substrate having a thickness of 200 microns as a whole was made porous in 24 minutes.

On the P-type (100) porous Si substrate 61 was grown an Si epitaxial layer 62 to a thickness of 0.5 microns by the MBE method. The deposition conditions are as follows:

Temperature: 700° C.

Pressure: $1 \times 10^{-9}$ Torr

Growth rate: 0.1 nm/sec.

Next, on the surface of the epitaxial layer 62 was superposed a fused silica substrate 63 applied with optical polishing, and by heating in a nitrogen atmosphere at 800° C. for 0.5 hour, the two substrates were bonded firmly together. Then, the porous Si substrate 61 was chemically etched away by use of hydrofluoric acid-nitric acid-acetic acid solution. As the result, the Si substrate 61 made porous having a thickness of 200 microns was removed in 2 minutes. A substrate having the monocrystalline Si layer 62 with a thickness of 0.5 μm on the fused silica 63 could be obtained. As the result of cross-sectional observation by transmission electron microscopy, it was confirmed that no new crystal defect had been introduced in the Si layer to maintain good crystallinity.

EXAMPLE 42

A P-type (100) monocrystalline Si substrate having a diameter of 3 inches and a thickness of 200 microns was anodized in a 50% HF solution. The current density at this time was 100 $mA/cm^2$. The porous structure formation rate at this time was 8.4 μm/min. and the P-type (100) Si substrate having a thickness of 200 microns as a whole was made porous in 24 minutes. On the P-type (100) porous Si substrate 61 was grown an Si epitaxial layer 62 to a thickness of 5 microns by the plasma CVD method. The deposition conditions are as follows:

Gas: $SiH_4$

Radio frequency power: 100 W

Temperature: 800° C.

Pressure: $1 \times 10^{-2}$ Torr

Growth rate: 2.5 nm/sec.

Next, on the surface of the epitaxial layer 62 was superposed a glass substrate having a softening point around 500° C. applied with optical polishing, and by heating in a nitrogen atmosphere at 450° C. for 0.5 hour, the two substrates were bonded firmly together. Then, the porous Si substrate 61 was chemically etched away by use of 6M KOH solution. As the result, the Si substrate 61 made porous having a thickness of 200 microns was removed in 2 minutes. A substrate having the monocrystalline Si layer 62 with a thickness of 5 μm on the low softening point glass 63 could be obtained.

EXAMPLE 43

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 61 was grown an Si epitaxial layer 62 to a thickness of 1.0 micron by the bias-sputtering method. The deposition conditions are as follows:

RF frequency: 100 MHz
Radio frequency power: 600 W
Temperature: 300° C.
Ar gas pressure: $8 \times 10^{-3}$ Torr
Growth time: 120 minutes
Target direct current bias: −200 V
Substrate direct current bias: +5 V.

Next, on the surface of the epitaxial layer 62 was superposed a glass substrate 63 having a softening point around 500° C. applied with optical polishing, and by heating in a nitrogen atmosphere at 450° C. for 0.5 hour, the two substrates were bonded firmly together. Then, the porous Si substrate 61 was chemically etched away by use of 7 M NaOH solution.

As described above, the chemical etching rate of ordinary Si monocrystal relative to 7 M NaOH solution is about a little less than 1 micron per minute, but the chemical etching rate of the porous layer is accelerated by about 100-fold thereof. That is, the Si substrate 61 made porous having a thickness of 200 microns was removed in 2 minutes. A substrate having the monocrystalline Si layer 62 with a thickness of 1.0 μm on the low melting point glass 63 could be formed.

Also the thickness of the monocrystalline Si layer obtained was examined by use of Scanning Ellipsometer. As the result, within the plane of the 3 inches wafer, the difference between the maximum value and the minimum value of the thickness of the monocrystalline Si layer was found to be suppressed 5% or less based on the maximum value of the thickness. As the result of plan-view observation of the monocrystalline Si layer by transmission electron microscopy, the dislocation defect density was found to be suppressed $1 \times 10^3/cm^2$ or less, whereby it could be confirmed that no new crystal defect had been introduced in the monocrystalline Si layer formation step to maintain good crystallinity. When the life time of minority carriers was measured for the monocrystalline layer by use of the MOS C-t method, a high value of $2.1 \times 10^{-3}$ sec. was exhibited.

EXAMPLE 44

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 61 was grown an Si epitaxial layer 62 to a thickness of 10 microns by the liquid phase growth method. The growth conditions are as follows:

Solvent: Sn
Growth temperature: 900° C.
Growth atmosphere: $H_2$
Growth time: 20 minutes.

Next, on the surface of the epitaxial layer 62 was superposed a glass substrate 63 having a softening point around 800° C. applied with optical polishing, and by heating in a nitrogen atmosphere at 750° C. for 0.5 hour, the two substrates were bonded firmly together. Then, the porous Si substrate 61 was chemically etched away by use of hydrofluoric acid-nitric acid-acetic acid solution. As the result, the Si substrate 61 made porous having a thickness of 200 microns was removed in 2 minutes. A substrate having the monocrystalline Si layer 62 with a thickness of 10 μm on the glass 63 could be obtained.

EXAMPLE 45

A P-type (100) monocrystalline Si substrate having a diameter of 3 inches and a thickness of 200 microns was anodized in a 50% HF solution. The current density at this time was 100 mA/cm². The porous structure formation rate at this time was 8.4 μm/min. and the P-type (100) Si substrate having a thickness of 200 microns as a whole was made porous in 24 minutes. On the P-type (100) porous Si substrate 61 was grown an Si epitaxial layer to a thickness of 1.0 micron by the low pressure CVD method. The deposition conditions are as follows:

Source gas: $SiH_4$ 800 SCCM
Carrier gas: $H_2$ 150 l/min.
Temperature: 850° C.
Pressure: $1 \times 10^{-2}$ Torr
Growth rate: 3.3 nm/sec.

Next, on the surface of the epitaxial layer 62 was superposed a fused silica substrate 63 applied with optical polishing, and by heating in a nitrogen atmosphere at 800° C. for 0.5 hour, the two substrates were bonded firmly together. Then, the porous Si substrate 61 was chemically etched away by use of hydrofluoric acid-nitric acid-acetic acid solution. As the result, the Si substrate 61 made porous having a thickness of 200 microns was removed in 2 minutes. A substrate having the monocrystalline Si layer 62 with a thickness of 1.0 μm on the fused silica 63 could be formed. When $SiH_2Cl_2$ as the source gas was employed, although it was necessary to elevate the growth temperature by some ten degrees, the accelerated chemical etching characteristics inherent in the porous substrate were maintained.

EXAMPLE 46

On a P-type (100) Si substrate 161 having a diameter of 4 inches and a thickness of 300 microns was grown an Si epitaxial layer 162 with a thickness of 1 micron by the CVD method. The deposition conditions are as follows:

Reactive gas flow rate:
$SiH_2Cl_2$ 1000 SCCM
$H_2$ 230 l/min.
Temperature: 1080° C.
Pressure: 80 Torr
Time: 2 min.

The substrate was anodized in a 50% HF solution. The current density at this time was 100 mA/cm². The porous structure formation rate at this time was 8.4 μm/min. and the P-type (100) Si substrate 161 having a thickness of 300 microns as a whole was made porous in 37 minutes. Only the P-type (100) Si substrate 161 was made porous in this anodization, and there was no change in the Si epitaxial layer 162. Next, on the surface of the epitaxial layer was superposed an optical polished fused silica glass substrate 164 and the two substrates were bonded together firmly by heating at 800° C. for 0.5 hour in a nitrogen atmosphere. Then, the porous Si substrate 163 was chemically etched away by use of hydrofluoric acid-nitric acid-acetic acid solution (1:3:8). As the result, the Si substrate 163 made porous having a thickness of 300 microns was removed in 4 minutes. A substrate having the monocrystalline Si layer 162 having a thickness of 1 $\mu$m on the fused silica glass substrate 164 could be formed.

Also the thickness of the monocrystalline Si layer obtained was examined by use of Scanning Ellipsometer. As the result, within the plane of the 4 inches wafer, the difference between the maximum value and the minimum value of the thickness of the monocrystalllne Si layer was found to be suppressed 7% or less based on the maximum value of the thickness. As the result of plan-view observation of the monocrystalline Si layer by transmission electron microscopy, the dislocation defect density was found to be suppressed $1 \times 10^3/cm^2$ or less, whereby it could be confirmed that no new crystal defect had been introduced in the monocrystalline Si layer formation process to maintain good crystallinity. When the life time of minority carriers was measured for the monocrystalline Si layer by use of the MOS C-t method, a high value of $2.0 \times 10_{-3}$ sec. was exhibited.

EXAMPLE 47

On a P-type (100) Si substrate 161 having a diameter of 3 inches and a thickness of 200 microns was grown an Si epitaxial layer 162 with a thickness of 0.5 micron by the CVD method. The deposition conditions are as follows:

Reactive gas flow rate:
$SiH_2Cl_2$ 1000 SCCM
$H_2$ 230 l/min.
Temperature: 1080° C.
Pressure: 80 Torr
Time: 1 min.

The substrate was anodized in a 50% HF solution. The current density at this time was 100 mA/cm². The porous structure formation rate at this time was 8.4 $\mu$m/min. and the P-type (100) Si substrate 161 having a thickness of 200 microns as a whole was made porous in 24 minutes. Only the P-type (100) Si substrate 161 was made porous in this anodization, and there was no change in the Si epitaxial layer 162.

Next, on the surface of the epitaxial layer 162 was superposed an optical polished fused silica glass substrate 164 and the two substrates were bonded together firmly by heating at 800° C. for 0.5 hour. Then, the porous Si substrate 163 was chemically etched away by use of hydrofluoric acid-nitric acid-acetic acid solution. As the result, the Si substrate made porous having a thickness of 200 microns was removed in 2 minutes. A monocrystalline Si layer having a thickness of 0.5 $\mu$m on the glass substrate could be formed. As the result of cross-sectional observation by transmission electron microscopy, it was confirmed that no new crystalline defect had been introduced in the Si layer to maintain good crystallinity.

EXAMPLE 48

On the surface of a P-type (100) Si substrate 161 having a diameter of 3 inches and a thickness of 200 microns was formed an N-type Si layer 162 with a thickness of 1 micron by ion implantation of protons. The amount of H⁺ implanted was $5 \times 10^{15}$ (ions/cm 2). The substrate was anodized in a 50% HF solution. The current density at this time was 100 mA/cm². The porous structure formation rate at this time was 8.4 $\mu$m/min. and the P-type (100) Si substrate 161 having a thickness of 200 microns as a whole was made porous in 24 minutes. Only the P-type (100) Si substrate 161 was made porous in this anodization, and there was no change in the N-type Si layer 162. Next, on the surface of the epitaxial layer 162 was superposed an optical polished fused silica glass substrate 164 and the two substrates were bonded together firmly by heating at 800° C. for 0.5 hour. Then, the porous Si substrate 163 was chemically etched away by use of hydrofluoric acid-nitric acid-acetic acid solution (1:3:8). As the result, the Si substrate 163 made porous having a thickness of 200 microns was removed in 4 minutes. A monocrystalline Si layer 162 with a thickness of 1.0 $\mu$m on the glass substrate 164 could be formed. As the result of cross-sectional observation by transmission electron microscopy, it was confirmed that no new crystal defect had been introduced in the Si layer to maintain good crystallinity.

EXAMPLE 49

A P-type (100) monocrystalline Si substrate having a diameter of 6 inches and a thickness of 600 microns was anodized in a 50% HF solution. The current density at this time was 10 mA/cm². In 10 minutes, a porous layer having a thickness of 20 microns was formed on the surface. On the P-type (100) porous Si substrate was grown an Si epitaxial layer to a thickness of 0.5 micron by the low pressure CVD method. The deposition conditions are as follows:

Gas: $SiH_2Cl_2$ (0.6 l/min), $H_2$ (100 l/min.)
Temperature: 850° C.
Pressure: 50 Torr
Growth rate: 0.1 $\mu$m/min.

Next, the surface of the epitaxial layer was thermally oxidized to 50 nm. On the thus obtained thermally oxidized film was superposed another silicon substrate having an oxidized layer of 0.8 micron on the surface, and by heating in a nitrogen atmosphere at 900° C. for 1.5 hours, the two substrates were firmly bonded together.

Thereafter, grinding of 585 microns was applied from the back side of the silicon substrate to have the porous layer exposed.

By the plasma CVD method, $Si_3N_4$ was deposited to a thickness of 0.1 $\mu$m to be coated on the bonded substrate. Subsequently, only the silicon nitride film on the porous substrate was removed by reactive ion etching.

Then, the bonded substrate was subjected to chemically selective etching by use of a hydrofluoric acid-nitric acid-acetic acid solution. After 15 minutes, the porous Si layer was chemically selectively etched to be completely removed, and only the monocrystalline Si layer as the etch-stop material remained without being chemically etched.

The chemical etching rate of non-porous Si monocrystal relative to the etchant is very low as about 40 angstroms even after 15 minutes, whereby the selective ratio of the etching rate between the non-porous layer and the porous layer is very large and the etched amount in the non-porous Si layer was practically negligible. After removal of the $Si_3N_4$ layer, a monocrystalline Si layer having a thickness of 0.5 $\mu$m on the silicon substrate having an insulating layer on the surface could be formed.

The same effect was also obtained, when Apiezon Wax or Electron Wax was coated in place of the $Si_3N_4$, and only the Si layer made porous could be completely removed.

Also the thickness of the monocrystalline Si layer obtained was examined by use of Scanning Ellipsometer. As the result, within the plane of the 6 inches wafer, the difference between the maximum value and the minimum value of the thickness of the monocrystalline Si layer was found to be suppressed 10% or less based on the maximum value of the thickness. As the result of plan view observation of the monocrystalline layer by a transmission electron microscopy, the dislocation defect density was found to be suppressed $1\times10^3/cm^2$ or less, whereby it could be confirmed that no new crystal defect had been introduced in the monocrystalline Si layer formation process to maintain good crystallinity. When the life time of minority carriers was measured for the monocrystalline Si layer by use of the MOS C-t method, a high value of $2.0\times10^{-3}$ sec. was exhibited.

What is claimed is:

1. A semiconductor member consisting essentially of a silicon support member, an insulator of a silicon oxide and an epitaxially grown non-porous silicon monocrystalline semiconductor region arranged on said insulator and having an area of 182 cm$^2$ to 500 cm$^2$, wherein within the area a dislocation defect density in said non-porous silicon monocrystalline semiconductor region is $2.0\times10^4/cm^2$ or less, and the lifetime of carriers in said non-porous silicon monocrystalline semiconductor region is $5.0\times10^{-4}$ sec or longer, and also the difference between the maximum thickness and the minimum thickness of said silicon monocrystalline semiconductor region is 10% or less based on said maximum thickness.

2. The semiconductor member according to claim 1, wherein said epitaxially grown non-porous silicon monocrystalline semiconductor region has a 6-inch diameter and wherein said difference is 10% or less based on said maximum thickness.

3. A semiconductor member consisting essentially of a silicon support member, an insulator of a silicon oxide and an epitaxially grown non-porous silicon monocrystalline semiconductor region having a 3-inch diameter arranged on said insulator, wherein a dislocation defect density in said non-porous silicon monocrystalline semiconductor region is $2.0\times10^4/cm^2$ or less, and the lifetime of carriers in said non-porous silicon monocrystalline semiconductor region is $5.0\times10^{-4}$ sec or longer, and also the difference between the maximum thickness and the minimum thickness of said silicon monocrystalline semiconductor region is 5% or less based on said maximum thickness.

4. A semiconductor member consisting essentially of a silicon support member, an insulator of a silicon oxide and an epitaxially grown non-porous silicon monocrystalline semiconductor region having a 4-inch diameter arranged on said insulator, wherein a dislocation defect density in said non-porous silicon monocrystalline semiconductor region is $2.0\times10^4/cm^2$ or less, and the lifetime of carriers in said non-porous silicon monocrystalline semiconductor region is $5.0\times10^{-4}$ sec or longer, and also the difference between the maximum thickness and the minimum thickness of said silicon monocrystalline semiconductor region is 8% or less based on said maximum thickness.

5. The semiconductor member according to claim 4, wherein said difference is 7% or less.

6. The semiconductor member according to claim 4, wherein said difference is 6% or less.

7. A semiconductor member consisting essentially of a silicon support member, an insulator of a silicon oxide and an epitaxially grown non-porous silicon monocrystalline semiconductor region having a 5-inch diameter arranged on said insulator, wherein a dislocation defect density in said non-porous silicon monocrystalline semiconductor region is $2.0\times10^4/cm^2$ or less, and the lifetime of carriers in said non-porous silicon monocrystalline semiconductor region is $5.0\times10^{-4}$ sec or longer, and also the difference between the maximum thickness and the minimum thickness of said silicon monocrystalline semiconductor region is 8% or less based on said maximum thickness.

* * * * *

UNITED STATES PATENT AND TRADEMARK OFFICE
CERTIFICATE OF CORRECTION

PATENT NO. : 6,150,031
DATED : November 21, 2000
INVENTOR(S) : Takao Yonehara

It is certified that error appears in the above-identified patent and that said Letters Patent is hereby corrected as shown below:

Column 1,
Line 27, "so" should be deleted;
Line 35, "prevented;" should read -- prevented; and --;
Line 39, "the" should be deleted;
Line 41, "these" should read -- about --;
Line 42, "some" should be deleted;
Line 47, "for" should read -- form --.

Column 2,
Line 61, "resin," should read -- remain, --.

Column 6,
Line 50, "see" should read -- sec. --.

Column 9,
Line 28, "monocrystalline. And," should read -- monocrystalline, and --.

Figure 1C:
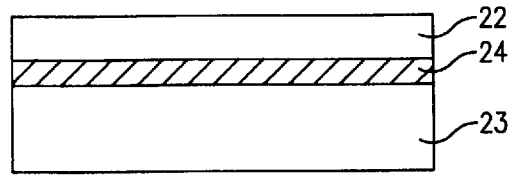

Column 10,
Line 45, "FIG. IC" should read -- FIG. 1C, --.

Column 14,
Line 44, "remain" should read -- remaining --;
Line 48, "also" should be deleted.

Column 15,
Lines 11 and 48, "also" should be deleted.

Column 16,
Line 27, "153,as" should read -- 153, as --;
Line 34, "Is" should read -- is --;
Line 47, "also" should be deleted.

Column 17,
Line 39, "also" should be deleted.

Column 22,
Line 8, "Tie:" should read -- Time: --;
Line 36, "$5x10_{15}$" should read -- $5x10^{15}$ --.

UNITED STATES PATENT AND TRADEMARK OFFICE
CERTIFICATE OF CORRECTION

PATENT NO. : 6,150,031
DATED : November 21, 2000
INVENTOR(S) : Takao Yonehara

It is certified that error appears in the above-identified patent and that said Letters Patent is hereby corrected as shown below:

Column 23,
Line 45, "1x10 Torr" should read -- $1 \times 10^{-2}$ Torr --;
Line 59, "Si 3N" should read -- $Si_3N_4$ --.

Column 28,
Lines 2 and 37, "the both" should read -- both --.

Column 29,
Lines 22 and 59, "the both" should read -- both --.

Column 30,
Line 46, "the both" should read -- both --.

Column 31,
Line 59, "the both" should read -- both --.

Column 35,
Line 10, "microns" should read -- micron --;
Line 67, "a" should be deleted.

Column 37,
Line 5, close up right margin;
Line 6, close up left margin;
Line 7, "a" should be deleted;
Line 46, "0.5 pa" should read -- 0.5 $\mu$m --.

Column 38,
Line 41, "substrate" should read -- substrates --.

Column 39,
Line 56 "$1 \times 10_{-2}$ Torr" should read -- $1 \times 10^{-2}$ Torr --.

Column 40,
Line 34, "substrate" should read -- substrates --.

Column 41,
Line 28, "$5 \times 10^{15}$ (ions/km)." should read -- $5 \times 10^{15}$ (ions/cm$^2$). --;
Line 65, "2.2x10 sec." should read -- $2.2 \times 10^{-3}$ sec. --

UNITED STATES PATENT AND TRADEMARK OFFICE
CERTIFICATE OF CORRECTION

PATENT NO. : 6,150,031
DATED : November 21, 2000
INVENTOR(S) : Takao Yonehara

It is certified that error appears in the above-identified patent and that said Letters Patent is hereby corrected as shown below:

Column 42,
Line 8, "of the over" should read -- over --.

Colum 45,
Line 28, "$2.0 \times 10_{-3}$ sec." should read -- $2.0 \times 10^{-3}$ sec. --.

Column 46,
Line 3, "(ions/cm 2)." should read -- $(ions/cm^2)$. --.

Column 47,
Line 7, "plan view" should read -- plan-view --;
Line 8, "a" should be deleted.

Signed and Sealed this

Twenty-seventh Day of November, 2001

Attest:

NICHOLAS P. GODICI
Attesting Officer   Acting Director of the United States Patent and Trademark Office